United States Patent
Makihara

(10) Patent No.: US 7,397,287 B2
(45) Date of Patent: Jul. 8, 2008

(54) SAMPLE HOLD CIRCUIT AND MULTIPLYING D/A CONVERTER HAVING THE SAME

(75) Inventor: Tetsuya Makihara, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 70 days.

(21) Appl. No.: 11/593,569

(22) Filed: Nov. 7, 2006

(65) Prior Publication Data

US 2007/0103203 A1    May 10, 2007

(30) Foreign Application Priority Data

Nov. 8, 2005    (JP) ............... 2005-323549
Jul. 26, 2006    (JP) ............... 2006-203205

(51) Int. Cl.
*H03K 5/00* (2006.01)

(52) U.S. Cl. ............... 327/91; 327/93; 327/94; 327/95; 327/96

(58) Field of Classification Search ............... None
See application file for complete search history.

(56) References Cited

U.S. PATENT DOCUMENTS

| | | | | |
|---|---|---|---|---|
| 5,689,201 A | * | 11/1997 | Temes et al. | 327/95 |
| 5,736,895 A | * | 4/1998 | Yu et al. | 327/554 |
| 6,127,958 A | | 10/2000 | Chang et al. | 341/155 |
| 6,147,522 A | * | 11/2000 | Rhode et al. | 327/93 |
| 6,169,427 B1 | * | 1/2001 | Brandt | 327/94 |
| 6,313,685 B1 | * | 11/2001 | Rabii | 327/307 |
| 6,445,331 B1 | * | 9/2002 | Stegers | 341/172 |
| 6,611,163 B1 | * | 8/2003 | Mukherjee et al. | 327/337 |
| 6,617,908 B1 | * | 9/2003 | Thomsen et al. | 327/337 |
| 6,636,084 B2 | * | 10/2003 | Sarraj | 327/95 |
| 6,642,871 B2 | | 11/2003 | Takeyabu et al. | 341/120 |
| 6,965,258 B2 | * | 11/2005 | Bogner | 327/94 |
| 7,002,506 B1 | * | 2/2006 | Tadeparthy et al. | 341/161 |
| 7,088,147 B2 | * | 8/2006 | Prasad et al. | 327/91 |

FOREIGN PATENT DOCUMENTS

| | | |
|---|---|---|
| JP | A-2001-006385 | 1/2001 |
| JP | A-2005-039529 | 2/2005 |

* cited by examiner

*Primary Examiner*—Tuan T. Lam
*Assistant Examiner*—Hiep Nguyen
(74) *Attorney, Agent, or Firm*—Posz Law Group, PLC

(57) ABSTRACT

A sample hold circuit includes an op-amp, first capacitors provided on an inverting side of the op-amp and second capacitors provided on a non-inverting side. The sample hold circuit is configured such that a total capacitance of the first and second capacitors to which an input voltage is applied in a sampling phase is equal to that of the first and second capacitors to which the input voltage is applied in a holding phase, a total capacitance of the first capacitors to which the input voltage is applied in the holding phase is equal to that of the second capacitors to which the input voltage is applied in the holding phase, and a total capacitance of the first capacitors to which the input voltage is applied in the sampling phase is different from that of the second capacitors to which the input voltage is applied in the sampling phase.

6 Claims, 11 Drawing Sheets

SAMPLE HOLD CIRCUIT AND MULTIPLYING D/A CONVERTER HAVING THE SAME

CROSS REFERENCE TO RELATED APPLICATION

This application is based on and incorporates herein by reference Japanese Patent Applications No. 2005-323549 filed on Nov. 8, 2005 and No. 2006-203205 filed on Jul. 26, 2006.

FIELD OF THE INVENTION

The present invention relates to a sample hold circuit and a multiplying D/A converter having the sample hold circuit.

BACKGROUND OF THE INVENTION

As disclosed in JP-2005-39529A and JP-2003-298418A, a pipeline analog to digital converter (ADC) includes a sub-ADC, a sub-digital to analog converter (DAC), an adder circuit, and an operational amplifier (op-amp).

The sub-ADC is a 1.5-bit ADC and converts an analog input voltage to an A/D conversion value consisting of three binary numbers. The sub-DAC outputs +Vref/2, 0, or, -Vref/2, in accordance with the A/D conversion value. The adder circuit adds the analog input voltage and the output of the sub-DAC. The op-amp amplifies the output of the adder circuit with a predetermined gain (e.g., gain of 2) and outputs the amplified output to the next stage.

As disclosed in JP-3046005, a cyclic ADC includes a switch, a sample hold circuit, a sub-ADC, a sub-DAC, a subtractor circuit, an amplifier, and a digital adder circuit.

The switch selects the analog input voltage or a feedback voltage. The sample hold circuit samples and holds the selected voltage. The sub-ADC converts the held voltage to a digital signal. The sub-DAC converts the output signal of the sub-ADC to an analog voltage. The subtractor circuit subtracts the output voltage of the sub-DAC from the output voltage of the sample hold circuit. The amplifier amplifies the output voltage of the subtractor circuit. In the digital adder circuit, the output signal of the sub-ADC is superimposed upon each other by one bit.

As described above, each of the pipeline ADC and the cyclic ADC needs a circuit for performing addition, subtraction, amplification, and holding operation. The op-amp is used as the circuit. In this case, a variation in a common-mode input voltage to the op-amp causes variations in characteristics such as gain and slew rate of the op-amp. As a result, an error is introduced into the output of the A/D converter. Therefore, it is preferable that an optimum common mode input voltage is applied to the op-amp in order to achieve stable, high gain and slew rate.

SUMMARY OF THE INVENTION

In view of the above-described problem, it is an object of the present invention to provide a sample hold circuit in which a common mode input voltage applied to an op-amp in a sampling phase is kept constant, and to provide an multiplying D/A converter having the sample hold circuit.

A sampling hold circuit for sampling and holding an input voltage includes an op-amp, first capacitors connected to an inverting input of the op-amp and second capacitors connected to a non-inverting input of the op-amp. The first capacitors are paired with the second capacitors.

In a sampling phase, the input voltage is applied to at least one of the first and second capacitors and a predetermined voltage is applied to the others of the first and second capacitors. In a holding phase, at least one of the paired capacitors are connected between the input and output of the op-amp and the input voltage is applied to at least one of the capacitors except the paired capacitor.

The sampling hold circuit is configured such that a total capacitance of the first and second capacitors to which an input voltage is applied in the sampling phase is equal to that of the first and second capacitors to which the input voltage is applied in the holding phase. Therefore, an input voltage applied to the op-amp is independent of the input voltage in the sampling phase. Thus, the input voltage applied to the op-amp in the holding phase can be kept constant at a predetermined common mode input voltage regardless of the magnitude of input voltage in the sampling phase. Thus, the op-amp can work with a suitable gain and slew rate.

Further, the sampling hold circuit is configured such that a total capacitance of the first capacitors to which the input voltage is applied in the holding phase is equal to that of the second capacitors to which the input voltage is applied in the holding phase. Therefore, the sampled voltage can be accurately held even when the input voltage changes in the holding phase.

Furthermore, the sampling hold circuit is configured such that a total capacitance of the first capacitors to which the input voltage is applied in the sampling phase is different from that of the second capacitors to which the input voltage is applied in the sampling phase. Therefore, the sampled voltage appears as the held voltage.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
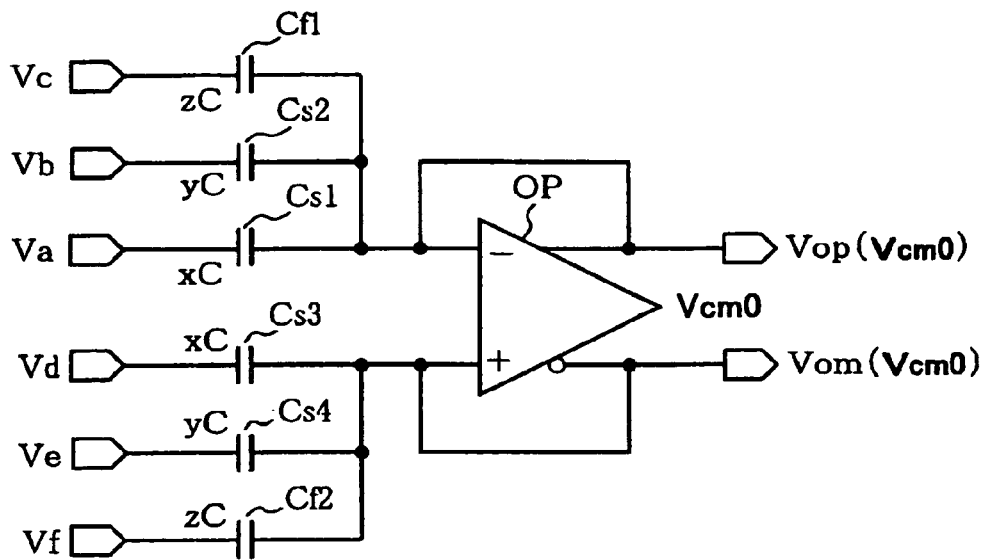
FIGS. 1A and 1B are schematics of a sample hold circuit according to a first embodiment of the present invention.
Figure 1B:
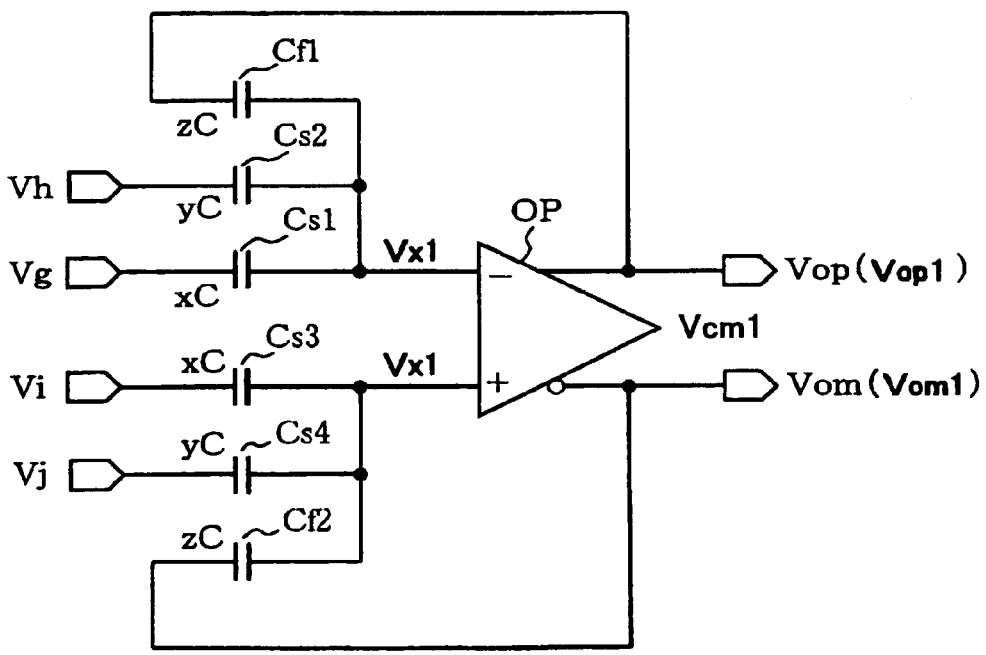

Referring to FIGS. 1A and 1B, a sample hold circuit according to the first embodiment includes an operational amplifier (op-amp) OP and six capacitors, three of which are provided on an inverting side of the op-amp OP and three of which are provided on a non-inverting side. One of the three capacitors provided on the inverting side is used as a feedback capacitor. Likewise, one of the three capacitors provided on the non-inverting side is used as the feedback capacitor.

The sample-hold circuit shown in FIGS. 1A and 1B implements features 1A to 1D listed below. Vin is an input voltage applied to the sample-hold circuit in a sampling phase and Vin+$\Delta$V is an input voltage applied to the sample-hold circuit in a holding phase.

(Feature 1A)

The sample-hold circuit converts a single ended input to a differential output.

(Feature 1B)

The input voltage Vin is applied to at least one of the capacitors in a sampling phase and the input voltage Vin+$\Delta$V is applied to at least one of the capacitors in a holding phase.

(Feature 1C)

The sample-hold circuit amplifies the input voltage Vin with a predetermined gain and holds the amplified input voltage. The held voltage (a differential output voltage) is independence of the input voltage Vin+$\Delta$V.

(Feature 1D)

An input voltage Vx1 (a common-mode input voltage) applied to the op-amp OP in the holding phase is independent of the input voltage Vin.

First, a generalized equation representing functions of the sample hold circuit is derived below. Then, necessary conditions for allowing the sample hold circuit to implement the features 1A-1D are determined based on the generalized equation.

As shown in FIGS. 1A and 1B, the sample hold circuit includes three capacitors Cs1, Cs2, Cf1, each of which has one end connected to an inverting input of the op-amp OP and three capacitors Cs3, Cs4, Cf2, each of which has one end connected to a non-inverting input of the op-amp OP.

The capacitors Cs1, Cs3 are paired as a first capacitor pair and each of the capacitors Cs1, Cs3 has a capacitance of xC, where x represents a positive integer and C represents a unit capacitance. The capacitors Cs2, Cs4 are paired as a second capacitor pair and each of the capacitors Cs2, Cs4 has a capacitance of yC, where y represents the positive integer and C represents the unit capacitance. The capacitors Cf1, Cf2 are paired as a third capacitor pair and each of the capacitors Cf1, Cf2 has a capacitance of zC, where z represents the positive integer and C represents the unit capacitance. The op-amp OP has a sufficiently large open-loop gain.

In the sampling phase, the sample hold circuit is configured as shown in FIG. 1A. The op-amp OP is configured as a voltage follower. A first voltage Vop from a non-inverting output of the op-amp OP is a common voltage Vcm0. A second voltage Vom from an inverting output of the op-amp OP is also the common voltage Vcm0.

To derive the generalized equation, voltages Va, Vb, Vc, Vd, Ve, and Vf are applied to the capacitors Cs1, Cs2, Cf1, Cs3, Cs4, and Cf2, respectively. At least one of the voltages Va, Vb, Vc, Vd, Ve, and Vf is the input voltage Vin and each of the others is a constant voltage.

In the holding phase, the sample hold circuit is configured as shown in FIG. 1B and one or two of the three capacitor pairs are used as the feedback capacitor. For example, as shown in FIG. 1B, the third capacitor pair of the capacitors Cf1, Cf2 is used as the feedback capacitor and the other ends of the capacitors Cf1, Cf2 are connected to the non-inverting and inverting outputs of the op-amp OP, respectively.

To derive the generalized equation, voltages Vg, Vh, Vi, and Vj are applied to the capacitors Cs1, Cs2, Cs3, and Cs4, respectively. At least one of the voltages Vg, Vh, Vi, and Vj is the input voltage Vin+$\Delta$V and each of the others is the constant voltage. The first voltage Vop from the non-inverting output of the op-amp OP is defined as a voltage Vop1 and the second voltage Vom from the inverting output of the op-amp OP is defined as a voltage Vom1.

When three necessary conditions listed below are met, the sample hold circuit implements the features 1A-1D.

(First Condition)

A generalized equation of the input voltage Vx1 includes no term of the input voltage Vin.

(Second Condition)

A generalized equation of the differential output voltage Vop1−Vom1 includes no term of the deference $\Delta$V.

(Third Condition)

The generalized equation of the differential output voltage Vop1−Vom1 includes the term of the input voltage Vin.

The generalized equations of the input voltage Vx1 and the differential output voltage Vop1−Vom1 are determined below.

According to the law of Conservation of Charge, the total amount of charge stored in capacitors Cs1, Cs2, Cf1, Cs3, Cs4, and Cf2 in the sampling phase is equal to that in the holding phase. Therefore, equations (1), (2) are obtained. The equations (1), (2) represent the inverting and non-inverting side, respectively.

$$x(Va-Vcm0)+y(Vb-Vcm0)+z(Vc-Vcm0)=x(Vg-Vx1)+ y(Vh-Vx1)+z(Vop1-Vx1) \quad (1)$$

$$x(Vd-Vcm0)+y(Ve-Vcm0)+z(Vf-Vcm0)=x(Vi-Vx1)+y (Vj-Vx1)+z(Vom1-Vx1) \quad (2)$$

The equations (1), (2) are rewritten as equations (3), (4), respectively.

$$xVa+yVb+zVc-(x+y+z)Vcm0=xVg+yVh+zVop1-(x+y+ z)Vx1 \quad (3)$$

$$xVd+yVe+zVf-(x+y+z)Vcm0=xVi+yVj+zVom1-(x+y+z) Vx1 \quad (4)$$

An equation (5) is obtained by subtracting the equation (4) from the equation (3).

$$z(Vop1-Vom1)=x(Va+Vi-Vd-Vg)+y(Vb+Vj-Ve-Vh)+z (Vc-Vf) \quad (5)$$

The equation (5) is rewritten as an equation (6). Thus, the generalized equation of the differential output voltage Vop1−Vom1 is obtained.

$$Vop1 - Vom1 = \frac{x\{(Va+Vi)-(Vd+Vg)\}+y\{(Vb+Vj)-(Vh+Ve)\}+z(Vc-Vf)}{z} \quad (6)$$

The equation (3) is rewritten as an equation (7).

$$(x+y+z)Vx1=xVg+yVh+zVop1-xVa-yVb-zVc+(x+y+z)Vcmo \quad (7)$$

An equation (8) represents a relationship between the voltages Vop1, Vom1 and a common voltage Vcm1. The equation (8) is rewritten as an equation (9).

$$Vop1 + Vom1 = 2Vcm1 \quad (8)$$

$$Vop1 = Vcm1 + \frac{1}{2}(Vop1 - Vom1) \quad (9)$$

An equation (10) is obtained by substituting the equation (6) into the equation (9) and then substituting the equation (9) into the equation (7).

$$(x+y+z)Vx1 = \quad (10)$$
$$\frac{z}{2}\left\{\frac{x}{z}(Va+Vi-Vd-Vg)+\frac{y}{z}(Vb+Vj-Ve-Vh)+(Vc-Vf)\right\}+$$
$$zVcm1 + x(Vg-Va) + y(Vh-Vb) - zVc + (x+y+z)Vcm0$$

The equation (10) is rewritten as an equation (11). Then, the equation (11) is rewritten as an equation (12). Then, the equation (12) is rewritten as an equation (13). Thus, the generalized equation of the input voltage Vx1 is obtained.

$$(x+y+z)Vx1 = \quad (11)$$
$$\frac{1}{2}\{x(Va+Vi-Vd-Vg)+y(Vb+Vj-Ve-Vh)+z(Vc-Vf)\}+$$
$$x(Vg-Va)+y(Vh-Vb)-zVc+(x+y+z)Vcm0+zVcm1$$

$$(x+y+z)Vx1 = \quad (12)$$
$$\frac{1}{2}\{x(-Va-Vd+Vg+Vi)+y(-Vb-Ve+Vh+Vj)+z(-Vc-Vf)\}+$$
$$(x+y+z)Vcm0+zVcm1$$

$$Vx1 = \quad (13)$$
$$\frac{x(-Va-Vd+Vg+Vi)+y(-Vb-Ve+Vh+Vj)+z(-Vc-Vf)}{2(x+y+z)} + Vcm0 + \frac{z}{x+y+z}Vcm1$$

(About First Condition)

The equation (13) representing the input voltage Vx1 has three terms. The first term depends on the voltages Va-Vj. The second term is the common voltage Vcm0. The third term is the product of the capacitance ratio z/(x+y+z) and the common voltage Vcm1. In the first term, all the voltages Va-Vf applied in the sampling phase are subtracted and all the voltages Vg-Vj applied in the holding phase are added. Therefore, a first requirement needed to be met to satisfy the first condition is described as follows: The total capacitance of the capacitors to which the input voltage Vin is applied in the sampling phase is equal to that of the capacitors to which the input voltage Vin+ΔV is applied in the holding phase.

(About Second Condition)

In the equation (6) representing the differential output voltage Vop1−Vom1, the voltages Va, Vb, Vc applied to the inverting side in the sampling phase are added and the voltages Vi, Vj applied to the non-inverting side in the holding phase are added. In contrast, the voltages Vd, Ve, Vf applied to the non-inverting side in the sampling phase are subtracted and the voltages Vg, Vh applied to the inverting side in the holding phase are subtracted. Therefore, a second requirement needed to be met to satisfy the second condition is described as follows: The total capacitance of the capacitors provide on the inverting side and to which the input voltage Vin+ΔV is applied in the holding phase is equal to that of the capacitors provide on the non-inverting side and to which the input voltage Vin+ΔV is applied in the holding phase.

(About Third Condition)

From the equation (6), a third requirement needed to be met to satisfy the third condition is described as follows: The total capacitance of the capacitors provide on the inverting side and to which the input voltage Vin is applied in the sampling phase is different from that of the capacitors provide on the non-inverting side and to which the input voltage Vin is applied in the sampling phase.

To verify the correctness of the three requirements, nine cases listed below are examined.

(Case1)

In the case where the voltage Vc is the input voltage Vin, each of the voltages Vg, Vi is the input voltage Vin+ΔV, and z=2x, all the three requirements are met. As a result, the equation (6) of the differential output voltage Vop1−Vom1 has the term Vin (i.e., gain of 1) and the equation (13) of the input voltage Vx1 has the term $\{1/(3+y/x)\}\Delta V$.

(Case2)

In the case where the voltage Vc is the input voltage Vin, each of the voltages Vg, Vi, Vh, Vj is the input voltage Vin+ΔV, and z=2x+2y, all the three requirements are met. As a result, the equation (6) has the term Vin (i.e., gain of 1) and the equation (13) has the term (1/3)ΔV.

(Case3)

In the case where the voltage Va is the input voltage Vin, each of the voltages Vh, Vj is the input voltage Vin+ΔV, and x=2y, all the three requirements are met. As a result, the equation (6) has the term (x/z)Vin (i.e., gain of x/z) and the equation (13) has the term $\{1/(3+z/y)\}\Delta V$.

(Case4)

In the case where each of the voltages Va, Vb is the input voltage Vin, each of the voltages Vg, Vj is the input voltage Vin+ΔV, and x=y, all the three requirements are met. As a result, the equation (6) has the term (2x/z)Vin (i.e., gain of 2x/z) and the equation (13) has the term $\{1/(2+z/x)\}\Delta V$.

(Case5)

In the case where each of the voltages Va, Vb is the input voltage Vin, each of the voltages Vg, Vi is the input voltage Vin+ΔV, and x=y, all the three requirements are not met. As a result, the equation (6) has no term Vin. Therefore, this case is inappropriate.

(Case6)

In the case where each of the voltages Va, Vc is the input voltage Vin, each of the voltages Vh, Vj is the input voltage Vin+ΔV, and x+z=2y, all the three requirements are met. As a result, the equation (6) has the term (1+x/z)Vin (i.e., gain of (1+x/z)) and the equation (13) has the term (1/3)ΔV.

(Case7)

In the case where each of the voltages Vc, Vd is the input voltage Vin, each of the voltages Vh, Vj is the input voltage Vin+ΔV, and x+z=2y, all the three requirements are met. As a result, the equation (6) has the term (1−x/z)Vin (i.e., gain of (1−x/z)) and the equation (13) has the term (1/3)ΔV.

(Case8)

In the case where each of the voltages Va, Vc, Vd is the input voltage Vin, each of the voltages Vh, Vj is the input voltage Vin+ΔV, and 2x+z=2y, all the three requirements are met. As a result, the equation (6) has the term Vin (i.e., gain of 1) and the equation (13) has the term $\{1/(3-x/y)\}\Delta V$.

(Case9)

In the case where each of the voltages Va, Vc, Vd is the input voltage Vin, each of the voltages Vg, Vi, Vh, Vj is the input voltage Vin+ΔV, and z=2y, all the three requirements are met. As a result, the equation (6) has the term Vin (i.e., gain of 1) and the equation (13) has the term $\{1/\{1+2/(1+x/y)\}\}\Delta V$.

Therefore, the first, second, and third requirements are needed to be met to satisfy the first, second, and third conditions, respectively. The first, second, and third requirements are again listed below.

(First Requirement)

The total capacitance of the capacitors to which the input voltage Vin is applied in the sampling phase is equal to that of the capacitors to which the input voltage Vin+ΔV is applied in the holding phase.

(Second Requirement)

The total capacitance of the capacitors provide on the inverting side and to which the input voltage Vin+ΔV is applied in the holding phase is equal to that of the capacitors provide on the non-inverting side and to which the input voltage Vin+ΔV is applied in the holding phase.

(Third Requirement)

The total capacitance of the capacitors provide on the inverting side and to which the input voltage Vin is applied in the sampling phase is different from that of the capacitors provide on the non-inverting side and to which the input voltage Vin is applied in the sampling phase Here, the total capacitance of the capacitors provided on the inverting side and to which the input voltage Vin is applied in the sampling phase is defined as αC, where α is the positive integer and C is the unit capacitance. The total capacitance of the capacitors provided on the non-inverting side and to which the input voltage Vin is applied in the sampling phase is defined as βC, where β is the positive integer and C is the unit capacitance. The total capacitance of the capacitors provided on the inverting side and to which the input voltage Vin+ΔV is applied in the holding phase is defined as γC, where γ is the positive integer and C is the unit capacitance. The total capacitance of the capacitors provided on the non-inverting side and to which the input voltage Vin+ΔV is applied in the holding phase is defined as ηC, where η is the positive integer and C is the unit capacitance.

In this case, the first, second, and third requirements are expressed by equations (14), (15), and an inequality (16), respectively.

$$\alpha+\beta=\gamma+\eta \tag{14}$$

$$\gamma=\eta \tag{15}$$

$$\alpha\neq\beta \tag{16}$$

In the sample holding circuit according to the first embodiment, the capacitors Cs1, Cs2, and Cf1 are connected to the inverting input of the op-amp OP and the capacitors Cs3, Cs4, Cf2 are connected to the non-inverting input of the op-amp OP.

In the sampling phase, the op-amp OP acts as the voltage follower and the input voltage Vin is applied to at least one of the capacitors.

In the holding phase, the capacitor Cf1 as the feedback capacitor is connected between the inverting input and the non-inverting output of the op-amp OP. Likewise, the capacitor Cf2 as the feedback capacitor is connected between the non-inverting input and the inverting output of the op-amp OP. The input voltage Vin+ΔV is applied to at least one of the capacitors except the capacitors Cf1, Cf2.

Since the first requirement is met, the input voltage Vx1 is independent of the input voltage Vin. Therefore, the input voltage Vx1 can be kept constant at a predetermined common mode input voltage (bias voltage). Thus, the op-amp OP can work with a suitable gain and slew rate. Further, Since the second and third requirements are met, the sampled single ended voltage Vin can be accurately converted to the differential output voltage Vop1 and held, even when variations in the input voltage occurs in the holding phase, i.e., even when ΔV is not zero.

The sample hold circuit converts the single ended input voltage Vin to the differential output voltage Vop-Vom1. Therefore, a signal to noise ratio is increased and accumulated noise of the input voltage Vin can be eliminated due to a high common mode voltage elimination ratio of the differential amplifier circuit.

Second Embodiment

A sample hold circuit according to the second embodiment is similar in configuration to the sample hold circuit according to first embodiment shown in FIGS. 1A and 1B. The first and second embodiments are different in the capacitance of the capacitors and in the manner in which the input voltages Vin, Vin+A are applied.

The sample-hold circuit of the second embodiment implements features 2A-2D listed below. The features 1A, 1B, 1D are the same as the features 2A, 2B, 2D, respectively.

(Feature 2A)

The sample-hold circuit converts the single ended input to the differential output.

(Feature 2B)

The input voltage Vin is applied to at least one of the capacitors in the sampling phase and the input voltage Vin+ΔV is applied to one of the capacitors in the holding phase.

(Feature 2C)

The sample-hold circuit amplifies the input voltage Vin with the predetermined gain and holds the amplified input voltage. The held voltage (differential output voltage Vop1−Vom1) is dependent on the difference ΔV.

(Feature 2D)

The input voltage Vx1 applied to the op-amp OP in the holding phase is independent of the input voltage Vin.

The feature 2C indicates that the holding phase is imperfect because the difference ΔV affects the differential output voltage Vop1−Vom1. However, in the case where the input voltage Vin is limited within a certain range, the sample hold circuit having the feature 2C can work properly by reducing the coefficient of the term ΔV as much as possible.

When two necessary conditions are met, the sample hold circuit implements the features 2A-2D. One is the first condition described in the first embodiment and the other is the fourth condition listed below.

(First Condition)

The generalized equation of the input voltage Vx1 includes no term Vin.

(Fourth Condition)

The generalized equation of the differential output voltage Vop1−Vom1 includes both the term Vin and the term $\Delta V$.

(About First Condition)

As described in the first embodiment, the first requirement is needed to be met to satisfy the first condition.

(About Fourth Condition)

From the equation (6), a fourth requirement needed to be met to satisfy the fourth condition is described as follows: The sum of the total capacitance of the capacitors provide on the inverting side and to which the input voltage Vin is applied in the sampling phase and the total capacitance of the capacitors provide on the non-inverting side and to which the input voltage Vin+$\Delta V$ is applied in the holding phase is different from the sum of the total capacitance of the capacitors provide on the non-inverting side and to which the input voltage Vin is applied in the sampling phase and the total capacitance of the capacitors provide on the inverting side and to which the input voltage Vin+$\Delta V$ is applied in the holding phase.

To verify the correctness of the two requirements, eight cases listed below are examined.

(Case10)

In the case where the voltage Vc is the input voltage Vin, each of the voltages Vi, Vj is the input voltage Vin+$\Delta V$, and z=x+y, the two requirements are met. As a result, the equation (6) of the differential output voltage Vop1−Vom1 has the term 2(Vin+$\Delta V$/2) (i.e., gain of 2) and the equation (13) of the input voltage Vx1 has the term (1/4)$\Delta V$.

(Case11)

In the case where the voltage Vc is the input voltage Vin, the voltage Vi is the input voltage Vin+$\Delta V$, and z=x, the two requirements are met. As a result, the equation (6) has the term 2(Vin+$\Delta V$/2) (i.e., gain of 2) and the equation (13) has the term $\{1/\{2(2+y/x)\}\}\Delta V$.

(Case12)

In the case where the voltage Va is the input voltage Vin and the voltage Vi is the input voltage Vin+$\Delta V$, the two requirements are met. As a result, the equation (6) has the term (x/z)(Vin+$\Delta V$) (i.e., gain of x/z) and the equation (13) has the term $\{x/\{2(x+y+z)\}\}\Delta V$.

(Case13)

In the case where each of the voltages Va, Vb is the input voltage Vin and each of the voltages Vi, Vj is the input voltage Vin+$\Delta V$, the two requirements are met. As a result, the equation (6) has the term $\{2(x+y)/z\}$(Vin+$\Delta V$/2) (i.e., gain of 2(x+y)/z) and the equation (13) has the term $\{1/\{2\{1+z/(x+y)\}\}\}\Delta V$.

(Case14)

In the case where each of the voltages Va, Vb is the input voltage Vin and each of the voltages Vi, Vh is the input voltage Vin+$\Delta V$, the two requirements are met. As a result, the equation (6) has the term (2x/z)$\{$Vin+$\{(x-y)/2x\}\Delta V\}$ (i.e., gain of 2x/z) and the equation (13) has the term $\{1/\{2\{1+z/(x+y)\}\}\}\Delta V$.

(Case15)

In the case where each of the voltages Va, Vb is the input voltage Vin, the voltage Vj is the input voltage Vin+$\Delta V$, and 2x=y, the two requirements are met. As a result, the equation (6) has the term (2x/z)(Vin+$\Delta V$) (i.e., gain of 2x/z) and the equation (13) has the term $\{1/(3+z/x)\}\Delta V$.

(Case16)

In the case where each of the voltages Va, Vc is the input voltage Vin, the voltage Vj is the input voltage Vin+$\Delta V$, and x+z=y, the two requirements are met. As a result, the equation (6) has the term (2y/z)(Vin+$\Delta V$/2) (i.e., gain of 2y/z) and the equation (13) has the term (1/4)$\Delta V$.

(Case17)

In the case where each of the voltages Vc, Vd is the input voltage Vin, the voltage Vj is the input voltage Vin+$\Delta V$, and x+z=y, the two requirements are met. As a result, the equation (6) has the term $2\{$Vin+(y/2z)$\Delta V\}$ (i.e., gain of 2) and the equation (13) has the term (1/4)$\Delta V$.

Therefore, the first and fourth requirements are needed to be met to satisfy the first and fourth conditions, respectively. The first and fourth requirements are again listed below.

(First Requirement)

The total capacitance of the capacitors to which the input voltage Vin is applied in the sampling phase is equal to that of the capacitors to which the input voltage Vin+$\Delta V$ is applied in the holding phase.

(Fourth Requirement)

The sum of the total capacitance of the capacitors provide on the inverting side and to which the input voltage Vin is applied in the sampling phase and the total capacitance of the capacitors provide on the non-inverting side and to which the input voltage Vin+$\Delta V$ is applied in the holding phase is different from the sum of the total capacitance of the capacitors provide on the non-inverting side and to which the input voltage Vin is applied in the sampling phase and the total capacitance of the capacitors provide on the inverting side and to which the input voltage Vin+$\Delta V$ is applied in the holding phase.

By using $\alpha$, $\beta$, $\gamma$, $\eta$ defined in the first embodiment, the first and forth requirements are expressed by the equation (14) and an inequality (17), respectively.

$$\alpha+\beta=\gamma+\eta \tag{14}$$

$$\alpha+\eta \neq \beta+\gamma \tag{17}$$

An inequality (18) is obtained by adding the equation (14) and the equation (17). An inequality (19) is obtained by subtracting the equation (14) from the equation (17).

$$\alpha \neq \gamma \tag{18}$$

$$\beta \neq \eta \tag{19}$$

Therefore, the forth requirement can be expressed by the inequalities (18), (19) instead of the inequality (17) and described as follows:

(Alternative Fourth Requirement)

While the total capacitance of the capacitors provide on the inverting side and to which the input voltage Vin is applied in the sampling phase is different from the total capacitance of the capacitors provide on the inverting side and to which the input voltage Vin+$\Delta V$ is applied in the holding phase, the total capacitance of the capacitors provide on the non-inverting side and to which the input voltage Vin is applied in the sampling phase is different from the total capacitance of the capacitors provide on the non-inverting side and to which the input voltage Vin+$\Delta V$ is applied in the holding phase.

Figure 2:
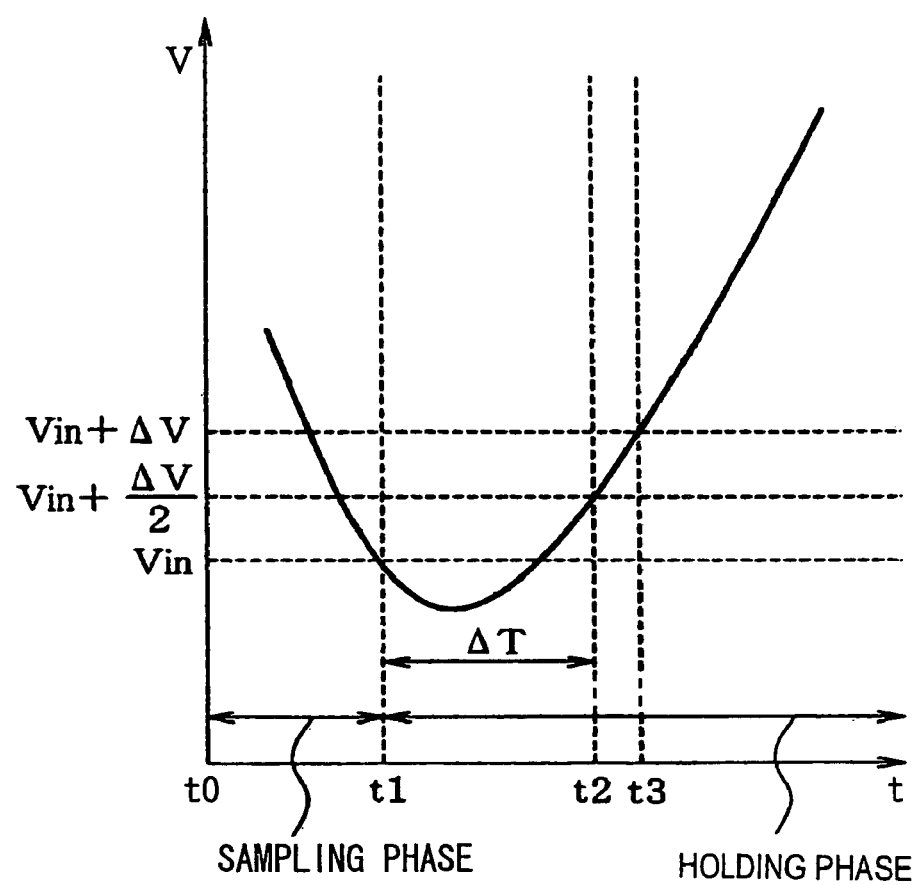
FIG. 2 is a graph showing relationship between a sampling timing and a holding timing of an input voltage in a sample hold circuit according to a second embodiment of the present invention.

FIG. 2 shows a relationship between the sampling and holding timing of the input voltage Vin in the case 10. A sampling period is between t0 and t1 and a holding period is after t1. In short, a transition from the sampling phase to the holding phase occurs at t1. The held voltage is actually used for, for example, A/D conversion, at t3. The voltage at t1 is the input voltage Vin and the voltage at t3 is the input voltage Vin+$\Delta V$.

In the second embodiment, the differential output voltage Vop-Vom1 changes with the difference +$\Delta V$. Therefore, the input voltage Vin needs to have a limited range. However, in the case 10, the equation (6) has the term 2(Vin+$\Delta V$/2). Therefore, the actual error at t1 is $\Delta V$/2, not $\Delta V$.

Specifically, when the sample hold circuit is not installed, a period between t1 and t3 is delay in the sampling timing and the error is ΔV. In contrast, when the sample hold circuit of the second embodiment is installed, a period ΔT between t1 and t2 is equivalent delay in the sampling timing and the error is reduced to ΔV/2.

The delay time ΔT can be reduced by reducing the period between t1 and t3. The error can be effectively reduced by reducing the coefficient of the term ΔV of the equation (6). Therefore, in a practical circuit, as long as the first and fourth requirements are met, the manner in which the input voltage Vin is applied and the capacitance of the capacitors are determined with consideration of the sampling time, the holding time, accuracy, and the limited range of the input voltage Vin.

As described above, in the sample hold circuit according to the second embodiment, since the first requirement is met, the op-amp OP works with the suitable gain and slew rate. Further, since the fourth requirement is met, the sample hold circuit can accurately hold the sampled voltage under the condition where the input voltage Vin has the limited range and the coefficient of the term ΔV of the equation (6) is small.

Third Embodiment

Figure 3A:
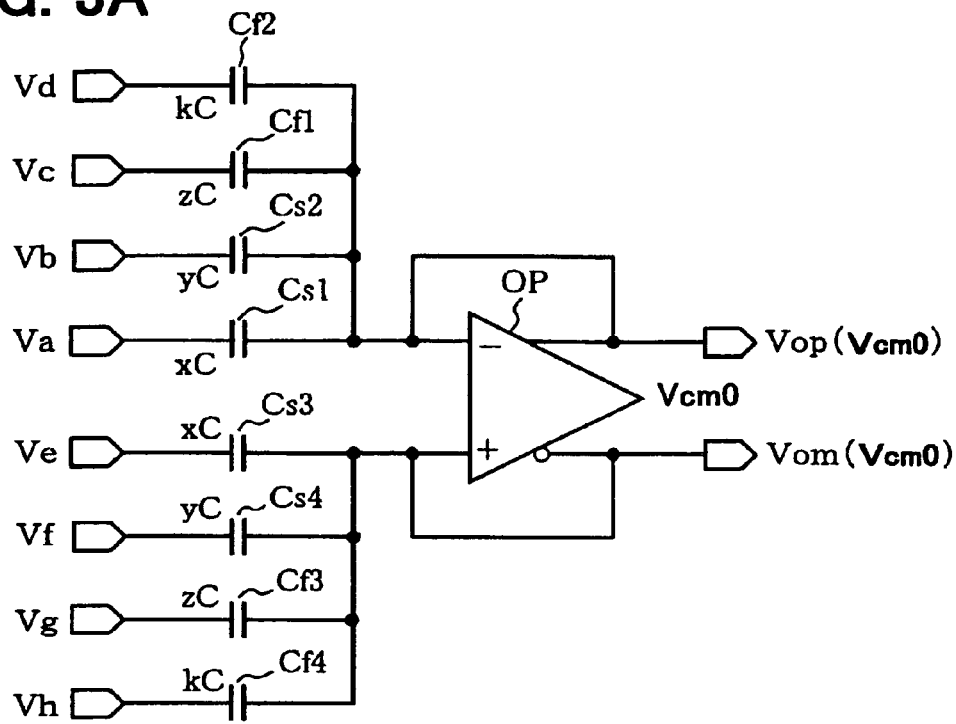
FIGS. 3A and 3B are schematics of a sample hold circuits according to a first embodiment of the present invention.
Figure 3B:
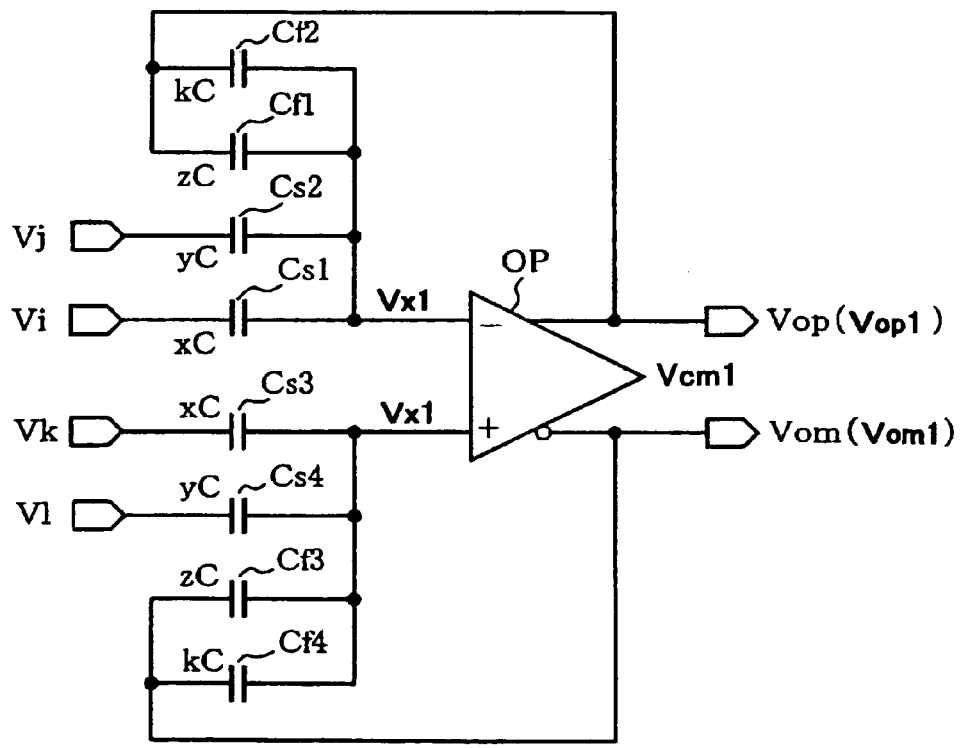

Referring to FIGS. 3A and 3B, a sample hold circuit according to the third embodiment includes the operational amplifier (op-amp) OP and eight capacitors, four of which are provided on the inverting side of the op-amp OP and four of which are provided on the non-inverting side.

The sample hold circuit according to the third embodiment implements the features 1A-1D described in the first embodiment or the features 2A-2D described in the second embodiment.

As shown in FIGS. 3A and 3B, the sample hold circuit includes four capacitors Cs1, Cs2, Cf1, Cf2, each of which has one end connected to the inverting input of the op-amp OP and four capacitors Cs3, Cs4, Cf3, Cf4, each of which has one end connected to the non-inverting input of the op-amp OP.

The capacitors Cs1, Cs3 are paired as the first capacitor pair and each of the capacitors Cs1, Cs3 has a capacitance of xC, where x represents the positive integer and C represents the unit capacitance. The capacitors Cs2, Cs4 are paired as the second capacitor pair and each of the capacitors Cs2, Cs4 has the capacitance of yC, where y represents the positive integer and C represents the unit capacitance. The capacitors Cf1, Cf3 are paired as a third capacitor pair and each of the capacitors Cf1, Cf3 has the capacitance of zC, where z represents the positive integer and C represents the unit capacitance. The capacitors Cf2, Cf4 are paired as a fourth capacitor pair and each of the capacitors Cf2, Cf4 has the capacitance of kC, where k represents the positive integer and C represents the unit capacitance.

In the sampling phase, the sample hold circuit is configured as shown in FIG. 3A. The op-amp OP is configured as the voltage follower. Voltages Va, Vb, Vc, Vd, Ve, Vf, Vg, and Vh are applied to the capacitors Cs1, Cs2, Cf1, Cf2, Cs3, Cs4, Cf3, and Cf4, respectively. At least one of the voltages Va, Vb, Vc, Vd, Ve, Vf, Vg, and Vh is the input voltage Vin and each of the others is the constant voltage.

In the holding phase, the sample hold circuit is configured as shown in FIG. 3B. The other ends of the capacitors Cf1, Cf2 are connected to the non-inverting output of the op-amp OP and the other ends of the capacitors Cf3, Cf4 are connected to the inverting output of the op-amp OP. Voltages Vi, Vj, Vk, and Vl are applied to the capacitors Cs1, Cs2, Cs3, and Cs4, respectively. At least one of the voltages Vi, Vj, Vk, and Vl is the input voltage Vin+ΔV and each of the others is the constant voltage.

Other configurations are the same between the first and third embodiments.

The generalized equations of the input voltage Vx1 and the differential output voltage Vop1−Vom1 are determined below.

According to the law of Conservation of Charge, equations (20), (21) are obtained. The equations (20), (21) represent the inverting and non-inverting side, respectively.

$$x(Va-Vcm0)+y(Vb-Vcm0)+z(Vc-Vcm0)+k(Vd-Vcm0) \\ =x(Vi-Vx1)+y(Vj-Vx1)+(z+k)(Vop1-Vx1) \quad (20)$$

$$x(Ve-Vcm0)+y(Vf-Vcm0)+z(Vg-Vcm0)+k(Vh-Vcm0) \\ =x(Vk-Vx1)+y(Vl-Vx1)+(z+k)(Vom1-Vx1) \quad (21)$$

The equations (20), (21) are rewritten as equations (22), (23), respectively.

$$xVa+yVb+zVc+kVd-(x+y+z+k)Vcm0=xVi+yVj+(z+k) \\ Vop1-(x+y+z+k)Vx1 \quad (22)$$

$$xVe+yVf+zVg+kVh-(x+y+z+k)Vcm0=xVk+yVl+(z+k) \\ Vom1-(x+y+z+k)Vx1 \quad (23)$$

An equation (24) is obtained by subtracting the equation (23) from the equation (22).

$$x(Va-Ve)+y(Vb-Vf)+z(Vc-Vg)+k(Vd-Vh)=x(Vi-Vk)+ \\ y(Vj-Vl)+(z+k)(Vop1-Vom1) \quad (24)$$

The equation (24) is rewritten as an equation (25).

$$(z+k)(Vop1-Vom1)=x(Va-Ve-Vi+Vk)+y(Vb-Vf-Vj+ \\ Vl)+z(Vc-Vg)+k(Vd-Vh) \quad (25)$$

The equation (25) is rewritten as an equation (26). Thus, the generalized equation of the differential output voltage Vop1−Vom1 is obtained.

$$Vop1 - Vom1 = \frac{x(Va - Ve - Vi + Vk) + y(Vb - Vf - Vj + Vl) + z(Vc - Vg) + k(Vd - Vh)}{z+k} \quad (26)$$

The equation (22) is rewritten as an equation (27).

$$(x+y+z+k)Vx1=(z+k)Vop1-x(Va-Vi)-y(Vb-Vj)-zVc- \\ kVd+(x+y+z+k)Vcm0 \quad (27)$$

An equation (28) is obtained by substituting the equation (6) into the equation (9) and then substituting the equation (9) into the equation (27).

$$(x+y+z+k)Vx1 = \quad (28)$$
$$\frac{z+k}{2} \cdot \frac{x(Va-Ve-Vi+Vk)+y(Vb-Vf-Vj+Vl)+z(Vc-Vg)+K(Vd-Vh)}{z+k} +$$
$$(z+k)Vcm1 - x(Va-Vi) - y(Vb-Vj) -$$
$$zVc - kVd + (x+y+z+k)Vcm0$$

The equation (28) is rewritten as an equation (29). Then, the equation (29) is rewritten as an equation (30). Thus, the generalized equation of the input voltage Vx1 is obtained.

$$(x+y+z+k)Vx1 = \qquad (29)$$
$$x(-Va-Ve+Vi+Vk)+$$
$$\frac{y(-Vb-Vf+Vj+Vl)+z(-Vc-Vg)+k(-Vd-Vh)}{2}+$$
$$(x+y+z+k)Vcm0+(z+k)Vcm1$$

$$Vx1 = \frac{x(-Va-Ve+Vi+Vk)+}{2(x+y+z+k)} + \qquad (30)$$
$$Vcm0 + \frac{z+k}{x+y+z+k}Vcm1$$

The denominator of the equation (26) represents the total capacitance of the capacitors provided on one side of the op-amp OP.

The denominator of the first term of the equation (30) represents the total capacitance of the capacitors provided on each side of the op-amp OP. The second term of the equation (30) represents the common voltage Vcm0.

Therefore, the first, second, and third requirements described in the first embodiment are generally met regardless of the number of the capacitors and feed back capacitors. Likewise, the first and forth embodiment described in the second embodiment are generally met regardless of the number of the capacitors and feed back capacitors. More than five capacitors can be provided on each side of the op-amp OP.

Fourth Embodiment

In the fourth embodiment, a differential input voltage is applied to the sample hold circuit shown in FIG. 1.

Here, non-inverting and inverting input voltages applied in the sampling phase are defined as Vinp and Vinm, respectively. In this case, a relationship between the non-inverting and inverting voltages Vinp, Vinm and a common mode voltage Vref is expressed by an equation (31). A relationship between a differential mode voltage Vin and the common mode voltage Vref is expressed by an equation (32).

$$Vinp+Vinm=2Vref \qquad (31)$$

$$Vinp-Vinm=Vin-Vref \qquad (32)$$

From the equations (31), (32), the non-inverting and inverting input voltages Vinp, Vinm, are expressed as equations (33), (34), respectively.

$$Vinp = \frac{1}{2}(Vin-Vref)+Vref \qquad (33)$$

$$Vinm = -\frac{1}{2}(Vin-Vref)+Vref \qquad (34)$$

Here, the non-inverting and inverting input voltages applied in the holding phase are defined as Vinp' and Vinm', respectively. The differential and common mode voltages in the holding phase are defined as Vin+ΔV and Vref+ΔVref, respectively. In this case, a relationship between the non-inverting and inverting input voltages Vinp', Vinm' and the common mode voltage Vref+ΔVref is expressed by equations (35), (36).

$$Vinp'+Vinm'=(Vinp+Vinm)+2\Delta Vref \qquad (35)$$

$$Vinp'+Vinm'=2(Vref+\Delta Vref) \qquad (36)$$

A relationship between the non-inverting and inverting input voltages Vinp', Vinm', the differential mode voltage Vin+ΔV, and the common mode voltage Vref+ΔVref is expressed by an equations (37).

$$Vinp'-Vinm'=(Vin+\Delta Vin)-(Vref+\Delta Vref) \qquad (37)$$

The equation (37) is rewritten as an equation (38).

$$Vinp'-Vinm'=(Vin-Vref)+(\Delta Vin-\Delta Vref) \qquad (38)$$

An equation (39) is obtained by substituting the equation (32) into the equation (38).

$$Vinp'-Vinm'=(Vinp-Vinm)+(\Delta Vin-\Delta Vref) \qquad (39)$$

The non-inverting input voltage Vinp' is expressed as an equation (40) by replacing the Vin, Vref in the equation (33) with the Vin+ΔV, Vref+ΔVref, respectively. The equation (40) is rewritten as an equation (41).

$$Vinp' = \frac{1}{2}\{(Vin+\Delta Vin)-(Vref+\Delta Vref)\}+(Vref+\Delta Vref) \qquad (40)$$

$$Vinp' = Vinp + \frac{1}{2}(\Delta Vin-\Delta Vref)+\Delta Vref \qquad (41)$$

Likewise, the inverting input voltage Vinm' is expressed as an equation (42) by replacing the Vin, Vref in the equation (34) with the Vin+ΔV, Vref+ΔVref, respectively. The equation (42) is rewritten as an equation (43).

$$Vinm' = -\frac{1}{2}\{(Vin+\Delta Vin)-(Vref+\Delta Vref)\}+(Vref+\Delta Vref) \qquad (42)$$

$$Vinm' = Vinm - \frac{1}{2}(\Delta Vin-\Delta Vref)+\Delta Vref \qquad (43)$$

The sample holding circuit according to the fourth embodiment implements features 4A-4D listed below.

(Feature 4A)

The sample holding circuit receives a differential input and produces a differential output.

(Feature 4B)

Each of the inverting and non-inverting input voltages Vinm, Vinp is applied to at least one of the capacitors in the sampling phase and each of the inverting and non-inverting input voltages Vinm', Vinp' is applied to at least one of the capacitors in the holding phase.

(Feature 4C)

The sample-hold circuit amplifies the differential input voltage Vinp-Vinm with a predetermined gain and holds the amplified differential input voltage. The held voltage (i.e., differential output voltage Vo1-Vom1) is independence of each of the inverting and non-inverting input voltages Vinm', Vinp', (i.e., differential and common mode voltages Vin+ΔV, Vref+ΔVref.

(Feature 4D)

The input voltage Vx1 applied to the op-amp OP in the holding phase is independent of each of the inverting and non-inverting input voltages Vinm, Vinp, (i.e., differential and common mode voltages Vin, Vref.

Although the fourth embodiment employs the differential input, the same conditions required for the first and second embodiments employing the single ended input are required for the fourth embodiment. Specifically, when the fourth embodiment is based on the first embodiment, each of the inverting and non-inverting input voltages Vinm, Vinp needs to meet all the first, second, and third requirements described in the first embodiment. When the fourth embodiment is based on the second embodiment, each of the inverting and non-inverting input voltages Vinm, Vinp needs to meet the first and fourth requirements described in the second embodiment.

Further, it is required that the equation of the differential output voltage Vop1−Vom1 has a term (Vinp−Vinm). Therefore, in the equation (6) or (26), it is required that the absolute value of the coefficient of the term Vinm is equal to that of the term Vinp and the sign of the coefficient of the term Vinm is opposite to that of the term Vinp. As a result, a fifth requirement described below is needed.

(Fifth Requirement)

A capacitance value obtained by subtracting a total capacitance of the non-inverting side capacitors to which the non-inverting input voltage Vinp is applied in the sampling phase from a total capacitance of the inverting side capacitors to which the non-inverting input voltage Vinp is applied in the sampling phase is equal to a capacitance value obtained by subtracting a total capacitance of the inverting side capacitors to which the inverting input voltage Vinm is applied in the sampling phase from a total capacitance of the non-inverting side capacitors to which the inverting input voltage Vinm is applied in the sampling phase To verify the correctness of the requirements, three cases listed below are examined.

(Case18)

In the case where the voltage Vf is the inverting input voltage Vinm, the voltage Vc is the non-inverting input voltage Vinp, the voltage Vg is the inverting input voltage Vinm', the voltage Vi is the non-inverting input voltage Vinp', and x=z, the second requirement is not met. As a result, the equation (6) of the differential output voltage Vop1−Vom1 has the term 2{(Vinp−Vinm)+(ΔVin−ΔVref)} (i.e., gain of 2) and the equation (13) of the input voltage Vx1 has the term −{1/(2+y/x)}ΔVin.

(Case19)

In the case where the voltage Vf is the inverting input voltage Vinm, the voltage Vc is the non-inverting input voltage Vinp, each of the voltages Vg, Vi is the inverting input voltage Vinm', each of the voltages Vh, Vj is the non-inverting input voltage Vinp', and 2x=2y=z, the second requirement is met. As a result, the equation (6) has the term 2(Vinp−Vinm) (i.e., gain of 2) and the equation (13) has the term (1/2)ΔVin.

(Case20)

In the case where the voltage Vd is the inverting input voltage Vinm, the voltage Va is the non-inverting input voltage Vinp, the voltage Vh is the inverting input voltage Vinm', the voltage Vj is the non-inverting input voltage Vinp', and x=y, the second requirement is not met. As a result, the equation (6) has the term (x/z){2{(Vinp−Vinm)+(ΔV−ΔVref)} (i.e., gain of 2x/z) and the equation (13) has the term {1/(2+z/y)}ΔVin.

Thus, the sample holding circuit can implement the features 4A-4D, when the requirements described in the first and second embodiments and the fifth requirement are met.

Figure 4:
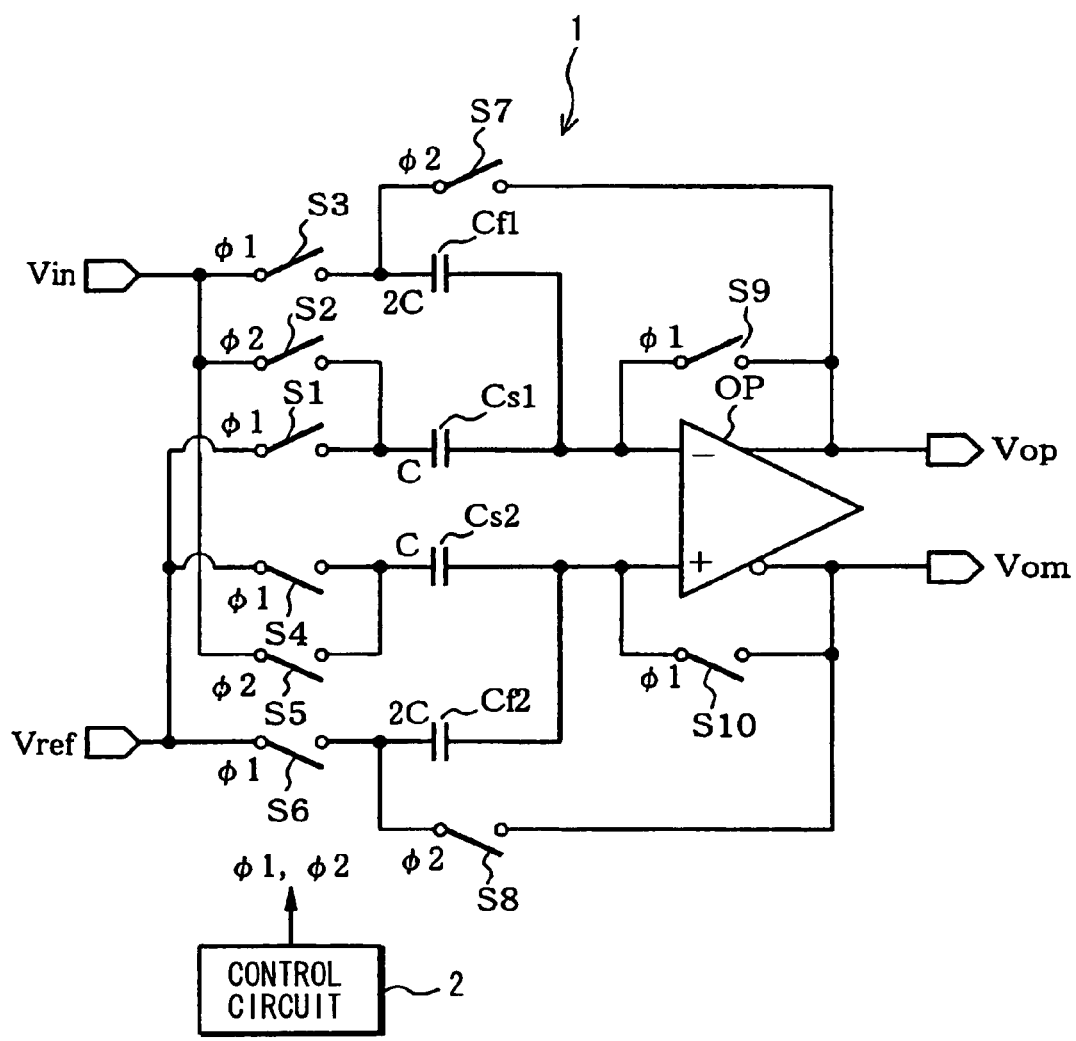
FIG. 4 is a schematic of a sample hold circuit according to a fifth embodiment of the present invention.

A sample hold circuit 1 as a concrete example is shown in FIG. 4. The sample hold circuit 1 corresponds to the sample hold circuit shown in FIGS. 1A and 1B and configured such that x=1, y=0, z=2, Va=Vd=Vf=Vref, Vc=Vin, Vg=Vi=Vin+ΔV, and Vb=Ve=Vh=Vj=0. The sample hold circuit 1 includes a first pair of capacitors Cs1, Cs2 and a second pair of capacitors Cf1, Cf2 and configured in the single ended input configuration. Each of the capacitors Cs1, Cs2 has a capacitance of C and each of the capacitors Cf1, Cf2 has a capacitance of 2C, where C is the capacitance unit. The sample hold circuit 1 satisfies all of the first, second, and third requirements.

Figure 5A:
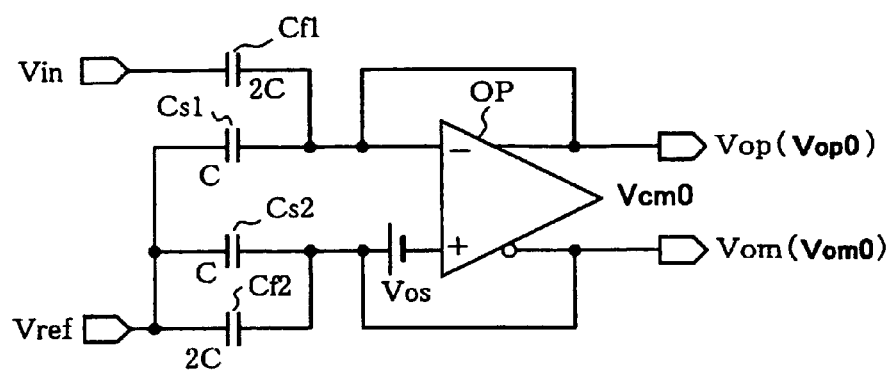
FIG. 5A is a schematic of the sample hold circuit of FIG. 4 in a sampling phase.
Figure 5B:
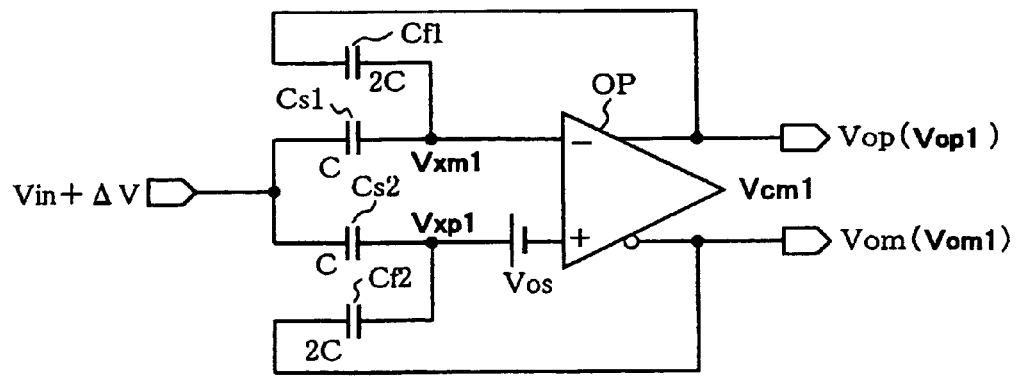
FIG. 5B is a schematic of the sample hold circuit of FIG. 4 in a holding phase.

In the sample hold circuit 1, an offset voltage Vos is taken into consideration as shown in FIGS. 5A and 5B. Therefore, the voltages Vom, Vop output from the inverting and non-inverting outputs of the op-amp OP in the sampling phase are defined as Vom0, Vop0, respectively. The voltages applied to the inverting and non-inverting inputs of the op-amp OP in the holding phase are defined as Vxm1, Vxp1, respectively.

As shown in FIG. 4, each of the capacitors Cs1, Cf1 has one end connected to the inverting input of the op-amp OP and each of the capacitors Cs2, Cf2 has one end connected to the non-inverting input of the op-amp OP. The capacitor Cs1 has the other end to which a reference voltage Vref and the input voltage Vin are applied through switches S1, S2, respectively. The capacitor Cs2 has the other end to which the reference voltage Vref and the input voltage Vin are applied through switches S4, S5, respectively. The capacitor Cf1 has the other end to which the input voltage Vin is applied through a switch S3. The capacitor Cf2 has the other end to which the reference voltage Vref is applied through a switch S6.

The capacitors Cf1, Cf2 are used as feedback capacitors. The other ends of the capacitors Cf1, Cf2 are connected to the non-inverting and inverting outputs of the op-amp OP through switches S7, S8, respectively. The inverting input and the non-inverting output of the op-amp OP are connected through a switch S9. The non-inverting input and the inverting output of the op-amp OP are connected through a switch S10.

Each of the switches S1-S10 is an analog switch. Each of the switches S1, S3, S4, S6, S9, and S10 is turned on when a first signal Φ1 is high and tuned off when the first signal Φ1 is low. Each of the switches S2, S5, S7, and S8 is turned on when a second signal Φ2 is high and tuned off when the second signal Φ2 is low. The first and second signals Φ1, Φ2 are complementary to each other.

A control circuit 2 holds the first signal Φ1 high and the second signal Φ2 low in the sampling phase shown in FIG. 5A. In contrast, the control circuit 2 holds the first signal Φ1 low and the second signal Φ2 high in the holding phase shown in FIG. 5B.

Below, the generalized equations of the differential output voltage Vop1−Vom1 and the input voltage Vx1 are determined with consideration of the offset voltage Vos.

According to the law of Conservation of Charge, equations (44), (45) are obtained. The equations (44), (45) represent the inverting and non-inverting side, respectively.

$$Cs1(Vref-Vop0)+Cf1(Vin-Vop0)=Cs1(Vin+\Delta V-Vxm1)+Cf1(Vop1-Vxm1) \qquad (44)$$

$$(Cs2+Cf2)(Vref-Vom0)=Cs2(Vin+\Delta V-Vxp1)+Cf2(Vom1-Vxp1) \qquad (45)$$

Since each of the capacitors Cs1, Cs2 has the capacitance of C and each of the capacitors Cf1, Cf2 has the capacitance of 2C, the equations (44), (45) are rewritten as equations (46), (47), respectively.

$$Vref+2Vin-3Vop0=Vin+\Delta V+2Vop1-3Vxm1 \qquad (46)$$

$$3(Vref-Vom0)=Vin+\Delta V+2Vom1-3Vxp1 \qquad (47)$$

An equation (48) is obtained by subtracting the equation (47) from the equation (46).

$$2(Vop1-Vom1)=2Vin-2Vref-3(Vop0-Vom0)-3(Vxp1-Vxm1) \qquad (48)$$

When the op-amp OP has a sufficiently large open-loop gain, a relationship between the output voltages Vop0, Vom0, and the offset voltage Vos is expressed as an equation (49).

Likewise, a relationship between the input voltages Vxp1, Vxm1, and the offset voltage Vos is expressed as an equation (50).

$$Vop0 - Vom0 = -Vos \quad (49)$$

$$Vxp1 - Vxm1 = Vos \quad (50)$$

An equation (51) is obtained by substituting the equations (49), (50) into the equation (48). Thus, the generalized equation of the differential output voltage Vop1–Vom1 is obtained.

$$Vop1 - Vom1 = Vin - Vref \quad (51)$$

The equation (46) is rewritten as an equation (52). A relationship between the output voltage Vop0, the offset voltage Vos, and the common voltage Vcm0 is expressed as an equation (53).

$$3Vxm1 = 2Vop1 - Vref - Vin + \Delta V + 3Vop0 \quad (52)$$

$$Vop0 = -\frac{1}{2}Vos + Vcm0 \quad (53)$$

An equation (54) is obtained by adding the equation (8) and the equation (51). An equation (55) is obtained by substituting the equations (53), (54) into the equation (52).

$$2Vop1 = Vin - Vref + 2Vcm1 \quad (54)$$

$$3Vxm1 = Vin - Vref + 2Vcm1 - Vref - Vin + \Delta V + 3\left(-\frac{1}{2}Vos + Vcm0\right) \quad (55)$$

The equation (55) is rewritten as an equation (56). Thus, the generalized equation of the inverting input voltage Vxm1 is obtained.

$$Vxm1 = Vcm0 + \frac{2}{3}(Vcm1 - Vref) - \frac{1}{2}Vos + \frac{1}{3}\Delta V \quad (56)$$

From the equations (50), (56), an equation (57) is obtained. Thus, the generalized equation of the non-inverting input voltage Vxp1 is obtained.

$$Vxp1 = Vcm0 + \frac{2}{3}(Vcm1 - Vref) + \frac{1}{2}Vos + \frac{1}{3}\Delta V \quad (57)$$

The sample hold circuit 1 according to the fifth embodiment satisfies all of the first, second, and third requirements. Therefore, the equation (51) of the differential output voltage Vop1–Vom1 has the term Vin and no term $\Delta V$ so that the second and third conditions are met. Each of the equations (56), (57) of the input voltages Vxp1, Vxm1 has no term Vin so that the first condition is met. Further, since the equation (51) has no term Vos, the offset voltage Vos does not affect the differential output voltage Vop1–Vom1.

Each of the equations (56), (57) has the term Vos/2 related to the offset voltage Vos and the term $\Delta V/3$ related to the difference $\Delta V$ between the input voltages of the sampling and holding phases. For example, when Vcm0=Vcm1=Vref=2.5 volts (i.e., a median of a power supply voltage), and Vos=10 millivolts, the inputs voltages Vxm1, Vxp1 are expressed as follows:

$$Vxm1 = 2.5 \text{ volts} - 5 \text{ millivolts} + \Delta V/3$$

$$Vxp1 = 2.5 \text{ volts} + 5 \text{ millivolts} + \Delta V/3$$

In normal use, since $\Delta V/3$ is much smaller than 2.5 volts, the op-amp Op works at the median voltage Vref of the power supply voltage so that the op-amp Op can work with a suitable gain and slew rate.

Figure 6A:
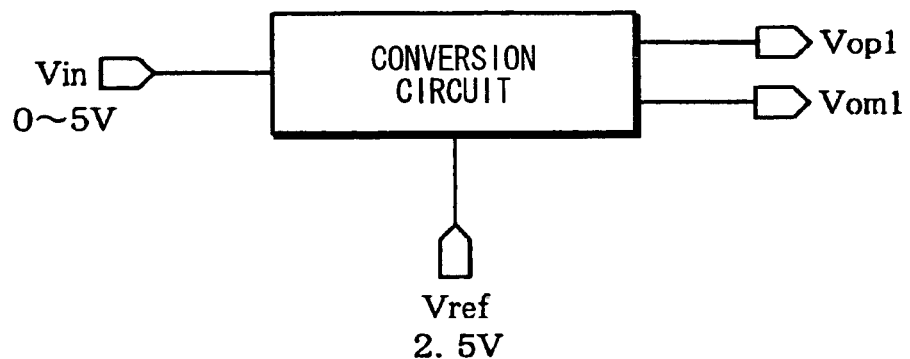
FIG. 6A is a schematic of an ideal conversion circuit for converting a single ended signal to a differential signal.
Figure 6B:
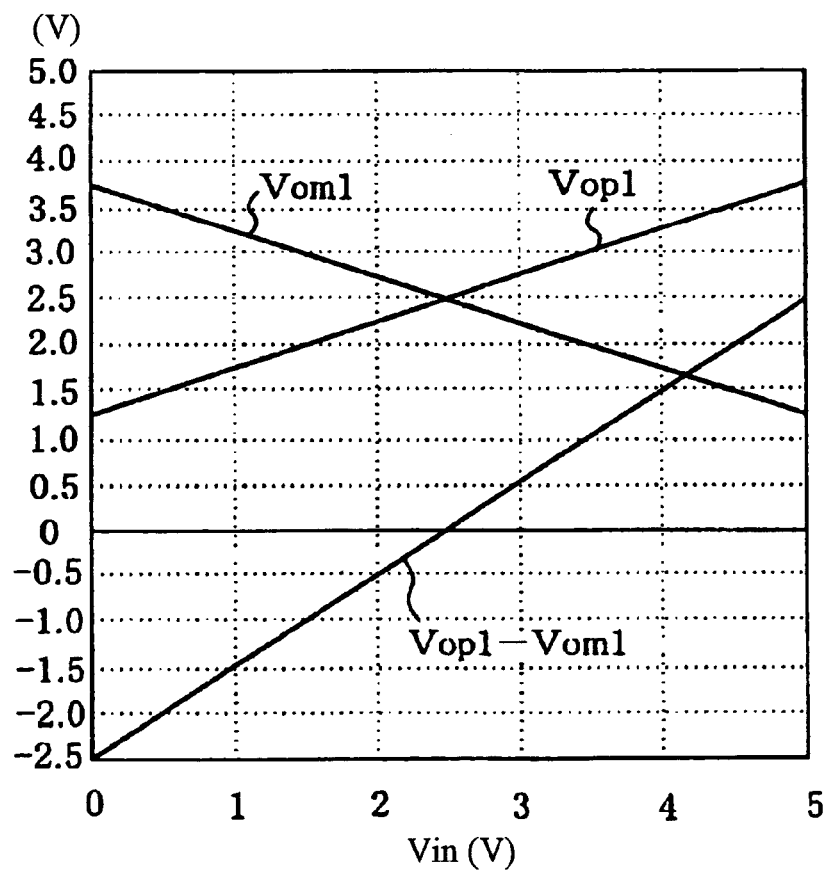
FIG. 6B is a graph showing a conversion characteristic of the conversion circuit of FIG. 6A.

According to the sample hold circuit 1, an ideal conversion circuit shown in FIG. 6A for converting the single ended signal to the differential signal can be obtained. In this case, relationships between the input voltage Vin, the output voltages Vop1, Vom1, the differential output voltage Vop1–Vom1, and the common mode output voltage Vref (e.g., 2.5 volts) are expressed as shown in equations (51), (58)-(60), and FIG. 6B.

$$Vop1 - Vom1 = Vin - Vref \quad (51)$$

$$Vop1 + Vom1 = 2Vref \quad (58)$$

$$Vop1 = \frac{1}{2}(Vin - Vref) + Vref \quad (59)$$

$$Vom1 = -\frac{1}{2}(Vin - Vref) + Vref \quad (60)$$

Sixth Embodiment

In the sixth embodiment, the sample hold circuit with the single ended input is applied to a multiplying digital to analog converter (MDAC).

Figure 7:
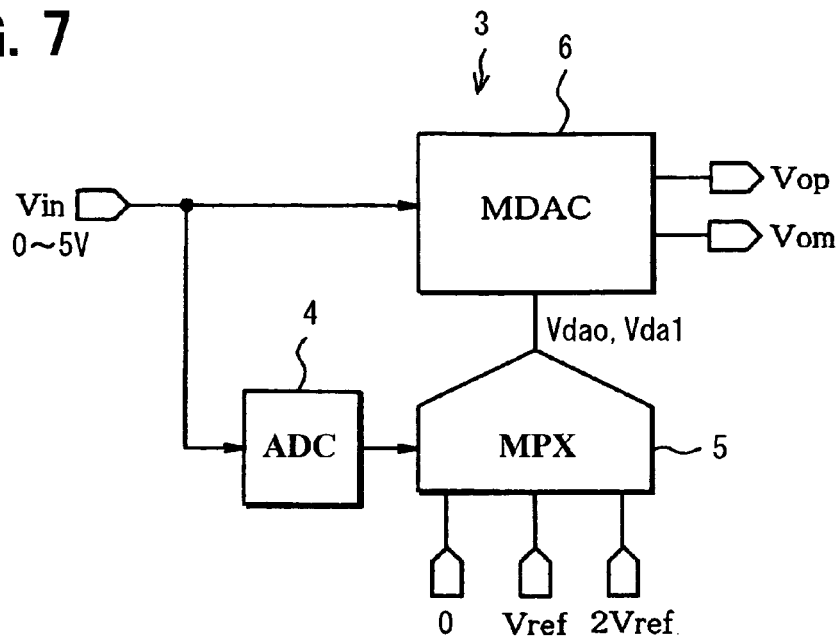
FIG. 7 is a schematic of a basic circuit according to a sixth embodiment of the present invention.

A circuit 3 shown in FIG. 7 is a basic circuit used in a conversion stage of a pipeline analog to digital converter (ADC) or a cyclic ADC. The circuit 3 includes a sub-ADC 4, a multiplexer (MPX) 5, and a MDAC 6. The sub-ADC 4 is a 1.5-bit ADC and converts the input voltage Vin to an A/D conversion value (i.e., input digital value) consisting of three binary numbers +1, 0, and −1. The MPX 5 may be incorporated in the MDAC 6.

Ideally, as shown in an equation (61), the MDAC 6 amplifies a value obtained by subtracting the reference voltage Vref from the input voltage Vin with a gain of 2 and subtracts a value depending on the A/D conversion value from the amplified value. Thus, the MDAC 6 obtains and holds the differential output voltage Vop1–Vom1.

$$Vop1 - Vom1 = 2(Vin - Vref) - (\pm 1, 0)Vref \quad (61)$$

Specifically, when the A/D conversion value is +1, 0, and −1, the differential output voltage Vop1–Vom1 is expressed as equations (62)-(64), respectively.

$$+1 \ldots Vop1 - Vom1 = 2Vin - Vref \quad (62)$$

$$0 \ldots Vop1 - Vom1 = 2Vin - 2Vref \quad (63)$$

$$-1 \ldots Vop1 - Vom1 = 2Vin - 3Vref \quad (64)$$

The circuit 3 achieves the equation (61) by using DAC voltages Vda0, Vda1 output from the MPX 5. Therefore, the MPX 5 selects the voltages Vda0, Vda1 in accordance with the A/D conversion value as follows:

+1 ... Vda0=0, Vda1=Vref

0 ... Vda0=Vref, Vda1=Vref

−1 ... Vda0=Vref, Vda1=2Vref

Figure 8:
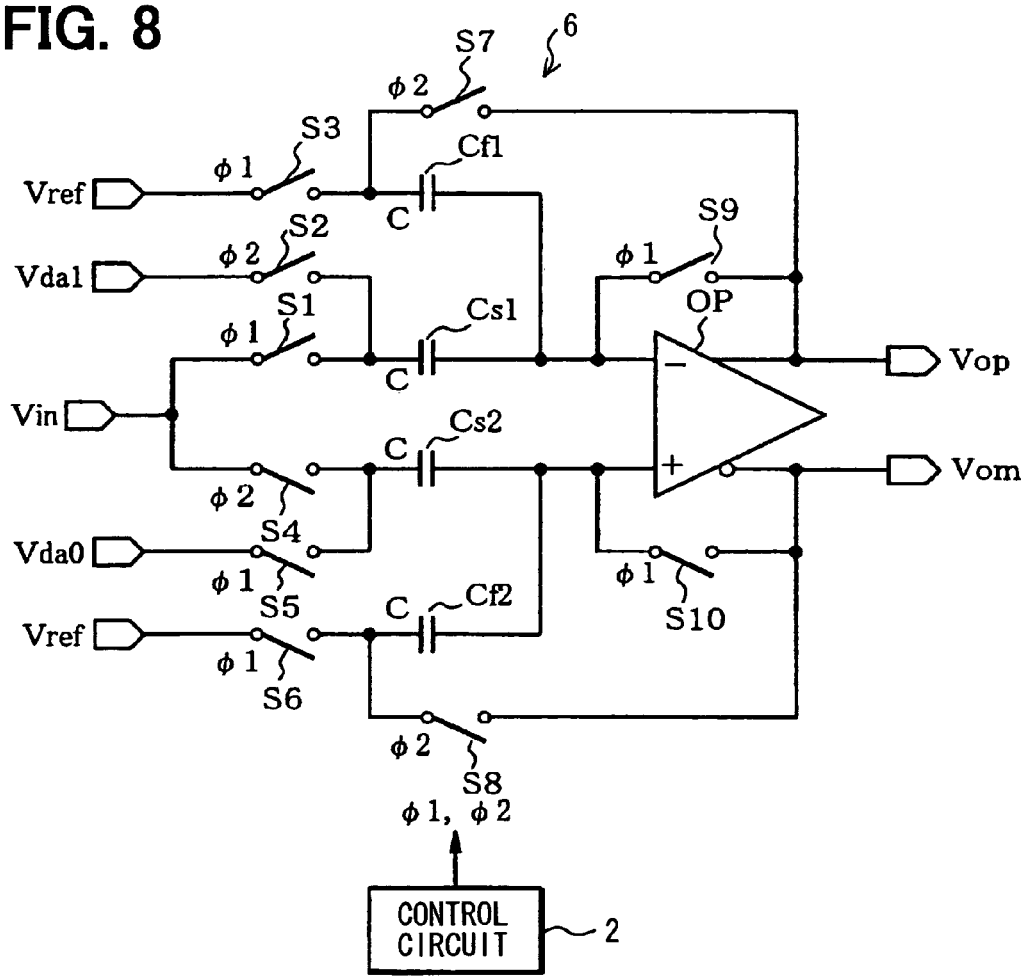
FIG. 8 is a schematic of a multiplying digital to analog converter used in the basic circuit of FIG. 7.

The MDAC 6 is configured as shown in FIG. 8. The MDAC 6 corresponds to the sample hold circuit that is shown in FIGS. 1A and 1B and configured such that x=1, y=0, z=1, Va=Vin, Vi=Vin+$\Delta V$, Vc=Vf=Vref, Vd=Vda0, Vg=Vda1, and Vb=Ve=Vh=Vj=0. The MDAC 6 includes a first capacitor pair of capacitors Cs1, Cs2 and a second capacitor pair of capacitors Cf1, Cf2 and is configured in the single ended input configuration. Each of the capacitors Cs1, Cs2, Cf1, and Cf2 has a capacitance of C, where C is the capacitance unit. Although the MDAC 6 satisfies the first and third requirements described in the first embodiment, the MDAC 6 does not satisfy the second requirement.

As shown in FIG. 8, the capacitor Cs1 has the other end to which the input voltage Vin and the voltage Vda1 are applied through switches S1, S2, respectively. The capacitor Cs2 has the other end to which the input voltage Vin and the voltage Vda0 are applied through switches S4, S5, respectively. The reference voltage Vref is applied to the other ends of the capacitors Cf1, Cf2 through switches S3, S6, respectively.

Each of the switches S1-S10 is an analog switch. Each of the switches S1, S3, S5, S6, S9, and S10 is turned on when a first signal Φ1 is high and tuned off when the first signal Φ1 is low. Each of the switches S2, S4, S7, and S8 is turned on when a second signal Φ2 is high and tuned off when the second signal Φ2 is low.

Other configurations are the same between the circuit 3 shown in FIG. 8 and the sample hold circuit 1 shown in FIG. 4.

Figure 9A:
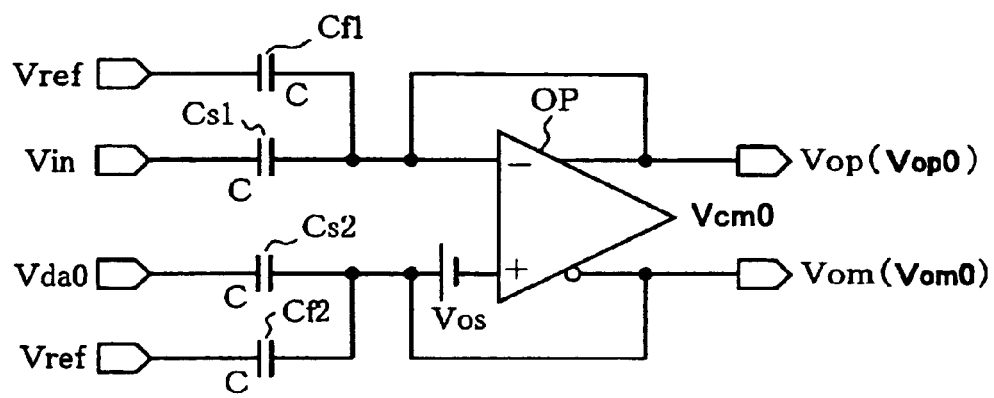
FIG. 9A is a schematic of the multiplying digital to analog converter of FIG. 8 in a sampling phase.

A control circuit 2 holds the first signal Φ1 high and the second signal Φ2 low in the sampling phase shown in FIG. 9A. In contrast, the control circuit 2 holds the first signal Φ1 low and the second signal Φ2 high in the holding phase shown in FIG. 9B.

Figure 9B:
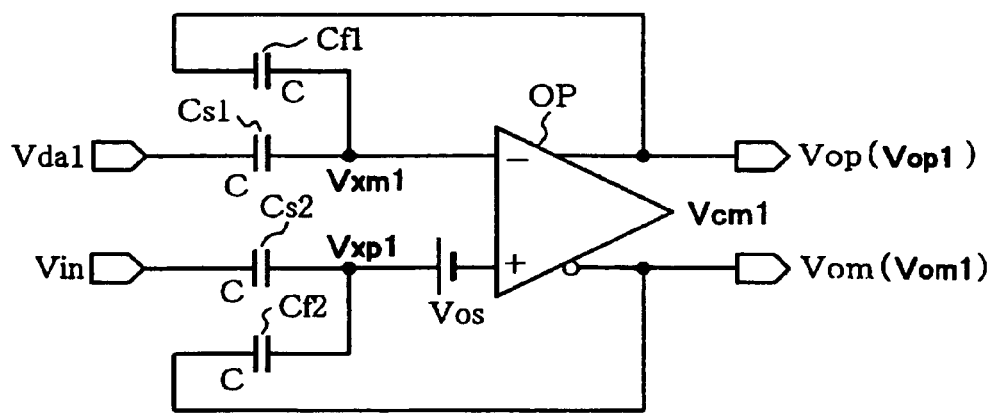
FIG. 9B is a schematic of the multiplying digital to analog converter of FIG. 8 in a holding phase.

In a conventional MDAC, the DAC voltage Vda0 or Vda1 is applied only in the holding phase. In contrast, in the MDAC 6, the DAC voltage Vda0 or Vda1 is applied not only in the holding phase, but also in the sampling phase, as shown in FIGS. 9A and 9B.

According to the law of Conservation of Charge, equations (65), (66) are obtained. The equations (65), (66) represent the inverting and non-inverting side, respectively.

$$Cs1(Vin-Vop0)+Cf1(Vref-Vop0)=Cs1(Vda1-Vxm1)+Cf1(Vop1-Vxm1) \quad (65)$$

$$Cs2(Vda0-Vom0)+Cf2(Vref-Vom0)=Cs2(Vin+\Delta V-Vxp1)+Cf2(Vom1-Vxp1) \quad (66)$$

Since each of the capacitors Cs1, Cs2, Cf1, and Cf2 has the capacitance of C, the equations (65), (66) are rewritten as equations (67), (68), respectively.

$$Vin+Vref-2Vop0=Vda1+Vop1-2Vxm1 \quad (67)$$

$$Vda0+Vref-2Vom0=Vin+\Delta V+Vom1-2Vxp1 \quad (68)$$

An equation (69) is obtained by subtracting the equation (68) from the equation (67).

$$Vop1-Vom1+Vda1-Vin-\Delta V+2(Vxp1-Vxm1)=Vin-Vda0-2(Vop0-Vom0) \quad (69)$$

An equation (70) is obtained by substituting the equations (49), (50) into the equation (69). Thus, the generalized equation of the differential output voltage Vop1−Vom1 is obtained. Since the second requirement is not met, the equation (70) has the term ΔV/2.

$$Vop1 - Vom1 = 2\left(Vin + \frac{1}{2}\Delta V\right) - (Vda0 + Vda1) \quad (70)$$

An equation (67) is rewritten as an equation (71). An equation (72) is obtained by adding the equation (8) and the equation (70).

$$2Vxm1 = Vop1 + Vda1 - Vin - Vref + 2Vop0 \quad (71)$$

$$2Vop1 = 2\left(Vin + \frac{1}{2}\Delta V\right) - (Vda0 + Vda1) + 2Vcm1 \quad (72)$$

An equation (73) is obtained by substituting the equations (53), (72) into the equation (71). The equation (73) is rewritten as an equation (74). Thus, the generalized equation of the inverting input voltage Vxm1 is obtained.

$$2Vxm1 = Vin + \frac{1}{2}\Delta V - \frac{1}{2}(Vda0 + Vda1) + Vcm1 + Vda1 - Vin - Vref - Vos + 2Vcm0 \quad (73)$$

$$Vxm1 = \frac{1}{4}(Vda1 - Vda0) + Vcm0 + \frac{1}{2}Vcm1 - \frac{1}{2}Vref - \frac{1}{2}Vos + \frac{1}{2}\Delta V \quad (74)$$

From the equations (50), (74), an equation (75) is obtained. Thus, the generalized equation of the non-inverting input voltage Vxp1 is obtained.

$$Vxp1 = \frac{1}{4}(Vda1 - Vda0) + Vcm0 + \frac{1}{2}Vcm1 - \frac{1}{2}Vref + \frac{1}{2}Vos + \frac{1}{2}\Delta V \quad (75)$$

Each of the equations (74), (75) has the term Vos/2 related to the offset voltage Vos and the term ΔV/2 related to the difference ΔV between the input voltages of the sampling and holding phases. For example, when Vcm0=Vcm1=Vref=2.5 volts (i.e., the median of the power supply voltage), and Vos=10 millivolts, the input voltage Vxm1 (Vxp1) is expressed from the equation (74) as follows:

+1 . . . Vxm1=3.125 volts−5 millivolts+ΔV/2

0 . . . Vxm1=2.5 volts−5 millivolts+ΔV/2

−1 . . . Vxm1=3.125 volts−5 millivolts+ΔV/2

In normal use, since ΔV/2 is sufficiently small, the op-amp Op works at the median voltage of the power supply voltage so that the op-amp Op can work with the suitable gain and slew rate.

Further, since the equation (70) has no term Vos, the offset voltage Vos does not affect the differential output voltage Vop1−Vom1. Although the equation (70) has the term ΔV, the coefficient of the term ΔV is 1/2 so that an error introduced by the difference ΔV is small. Thus, in the case where the input voltage Vin is limited within the certain range, the MDAC 6 can have sufficient accuracy. Therefore, the pipeline ADC and the cyclic ADC can have sufficient accuracy by using the MDAC 6.

Seventh Embodiment

In the seventh embodiment, the sample hold circuit with the differential input is applied to the MDAC.

Figure 10:
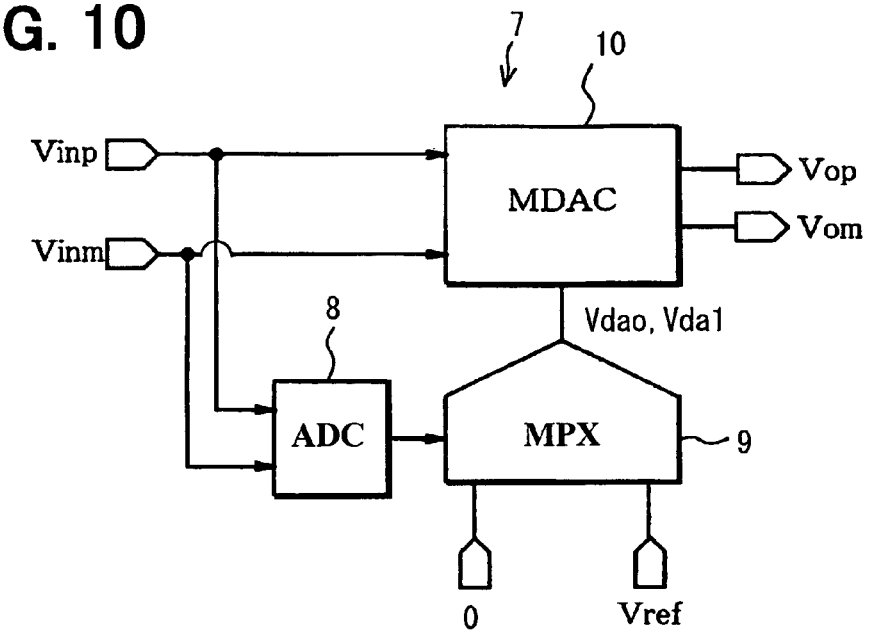
FIG. 10 is a schematic of a basic circuit according to a seventh embodiment of the present invention.

A circuit 7 shown in FIG. 10 is a basic circuit used in the conversion stage of the pipeline ADC or the cyclic ADC. The circuit 7 includes a sub-ADC 8, a MPX 9, and a MDAC 10. The sub-ADC 8 is the 1.5-bit ADC and converts the differential input voltages Vinp, Vinm to the A/D conversion value consisting of three binary numbers +1, 0, and −1. The MPX 9 may be incorporated in the MDAC 10.

Ideally, as shown in an equation (76), the MDAC 10 amplifies the differential input voltage Vinp-Vinm with the gain of 2 and subtracts the value depending on the A/D conversion value from the amplified differential input voltage 2(Vinp-Vinm). Thus, the MDAC 10 obtains and holds the differential output voltage Vop1-Vom1. The equation (76) is obtained by substituting the equation (32) into the equation (61).

$$Vop1-Vom1=2(Vinp-Vinm)-(\pm1,0)Vref \quad (76)$$

Figure 11:
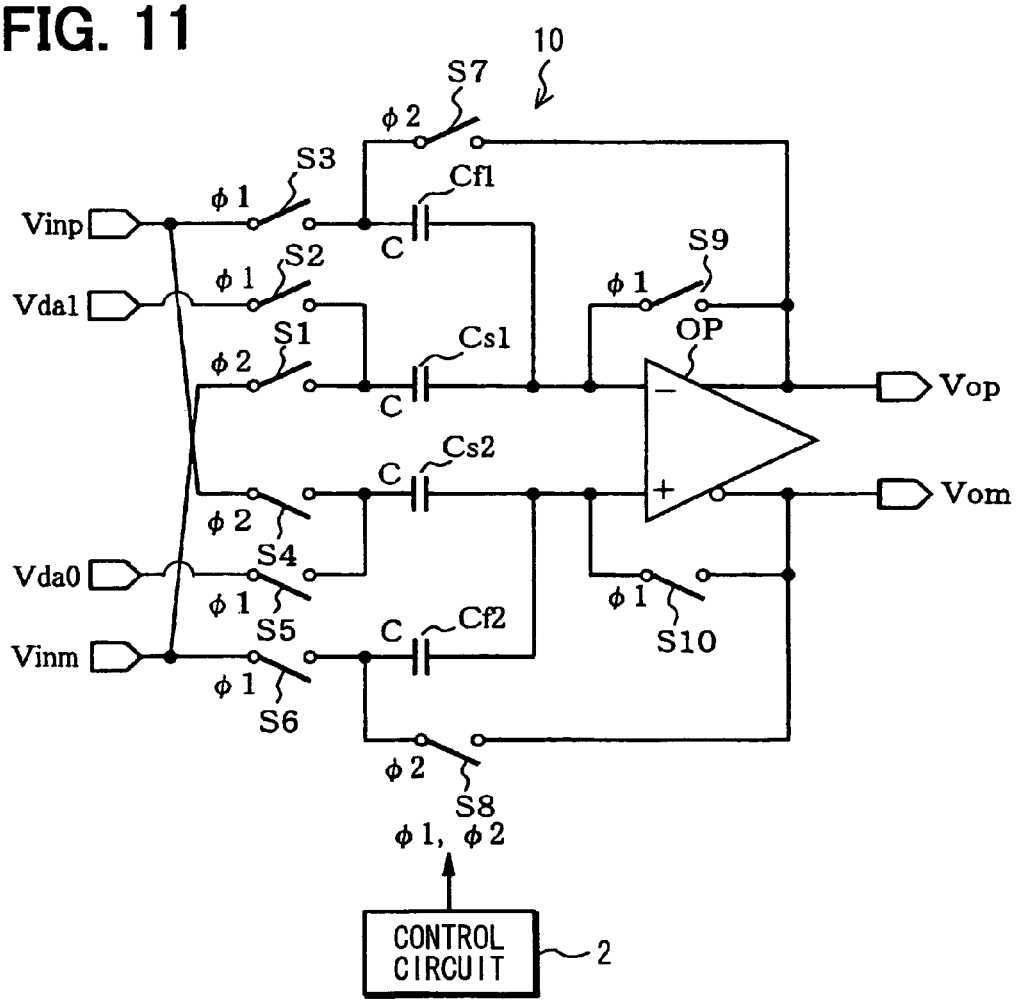
FIG. 11 is a schematic of a multiplying digital to analog converter used in the basic circuit of FIG. 10.

The MDAC 10 is configured as shown in FIG. 11. The MDAC 10 corresponds to the sample hold circuit that is shown in FIGS. 1A and 1B and configured such that x=1, y=0, z=1, Va=Vda1, Vc=Vinp, Vd=Vda0, Vf=Vinm, Vg=Vinm+ΔVinm, Vi=Vinp+ΔVinp, and Vb=Ve=Vh=Vj=0. The MDAC 10 includes the first capacitor pair of capacitors Cs1, Cs2 and the second capacitor pair of capacitors Cf1, Cf2 and is configured in the differential input configuration. Each of the capacitors Cs1, Cs2, Cf1, and Cf2 has the capacitance of C, where C is the capacitance unit. Although the MDAC 10 satisfies the first and third requirements described in the first embodiment and the fifth requirement described in the fourth embodiment, the MDAC 10 does not satisfy the second requirement described in the first embodiment.

As shown in FIG. 11, the capacitor Cs1 has the other end to which the input voltage Vinm and the voltage Vda1 are applied through switches S1, S2, respectively. The capacitor Cs2 has the other end to which the input voltage Vinp and the voltage Vda0 are applied through switches S4, S5, respectively. The input voltages Vinp, Vinm are applied to the other ends of the capacitors Cf1, Cf2 through switches S3, S6, respectively.

Each of the switches S1-S10 is an analog switch. Each of the switches S2, S3, S5, S6, S9, and S10 is turned on when a first signal Φ1 is high and tuned off when the first signal Φ1 is low. Each of the switches S1, S4, S7, and S8 is turned on when a second signal Φ2 is high and tuned off when the second signal Φ2 is low.

Other configurations are the same between the MDAC 10 shown in FIG. 11 and the sample hold circuit 1 shown in FIG. 4.

Figure 12A:
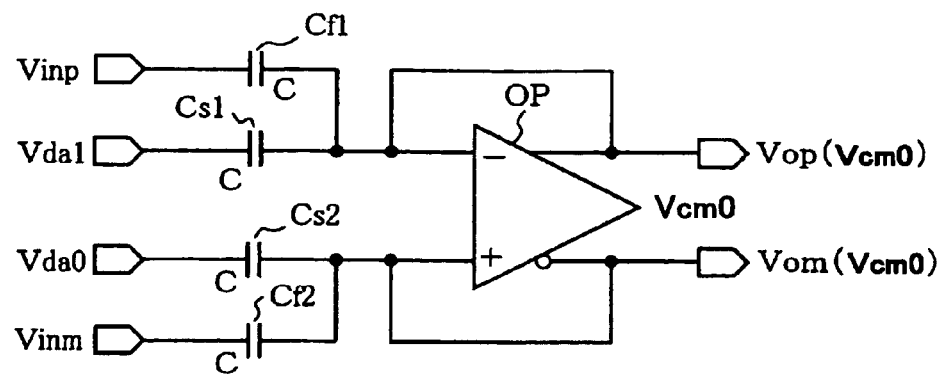
FIG. 12A is a schematic of the multiplying digital to analog converter of FIG. 11 in a sampling phase.
Figure 12B:
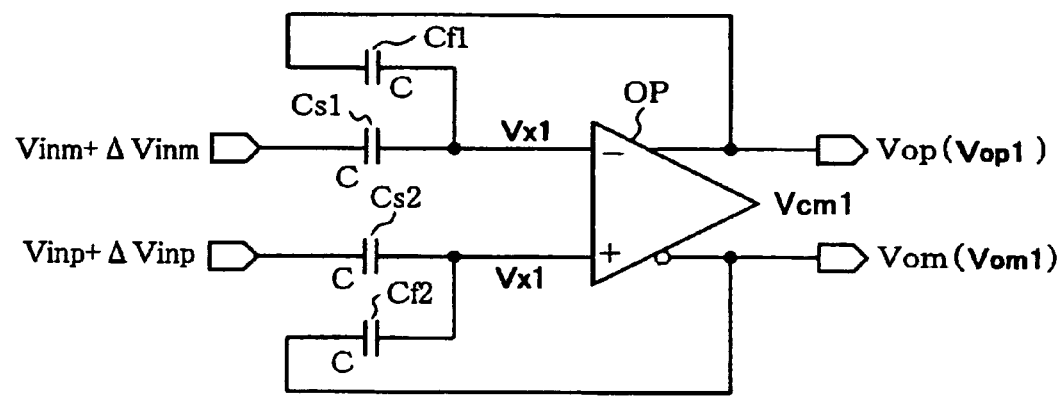
FIG. 12B is a schematic of the multiplying digital to analog converter of FIG. 10 in a holding phase.

A control circuit 2 holds the first signal Φ1 high and the second signal Φ2 low in the sampling phase shown in FIG. 12A. In contrast, the control circuit 2 holds the first signal Φ1 low and the second signal Φ2 high in the holding phase shown in FIG. 12B.

In the conventional MDAC, the DAC voltages Vda0, Vda1 are applied only in the holding phase. In contrast, in the MDAC 10, the DAC voltages Vda0, Vda1 are applied not only in the holding phase, but also in the sampling phase, as shown in FIG. 12A.

It is defined that differential input voltages in the sampling phase are Vinp, Vinm and differential input voltages in the holding phase are Vinp+ΔVinp, Vinm+ΔVinm. In this case, a differential mode component Vin(diff) in the sampling phase is expressed as an equation (77). A differential mode component Vin(diff)+ΔVin(diff) in the holding phase is expressed as an equation (78). A common mode component Vin(com) in the sampling phase is expressed as an equation (79). A common mode component Vin(com)+ΔVin(com) in the holding phase is expressed as and equation (80).

$$Vin(diff) = Vinp - Vinm \quad (77)$$

$$Vin(diff) + \Delta Vin(diff) = Vinp - Vinm + \Delta Vinp - \Delta Vinm \quad (78)$$

$$Vin(com) = \frac{1}{2}(Vinp + Vinm) \quad (79)$$

$$Vin(com) + \Delta Vin(com) = \frac{1}{2}(Vinp + Vinm + \Delta Vinp + \Delta Vinm) \quad (80)$$

When the offset voltage Vos of the op-amp OP is not taken into consideration, the differential output voltage Vop1-Vom1 is expressed as an equation (81). The equation (81) is obtained by substituting x=z, y=0, Va=Vda1, Vc=Vinp, Vd=Vda0, Vf=Vinm, Vg=Vinm+ΔVinm, Vi=Vinp+ΔVinp, and Vb=Ve=Vh=Vj=0 into the equation (6). The equation (81) has no term Vin(com). However, the equation (81) has the term ΔVin(diff)/2, because the second requirement is not met.

$$Vop1 - Vom1 = 2\left\{Vin(diff) + \frac{1}{2}\Delta Vin(diff)\right\} + (Vda1 - Vda0) \quad (81)$$

The MPX 9 selects the voltages Vda0, Vda1 in accordance with the A/D conversion value as follows: Because of the differential input, the DAC voltage has two values 0, Vref (e.g., 2.5 volts).

+1 ... Vda0=0, Vda1=Vref

0 ... Vda0=Vda1=0, or Vda0=Vda1=Vref

−1 ... Vda0=Vref, Vda1=0

The input voltage Vx1 is expressed as an equation (82). The equation (82) is obtained by substituting x=z, y=0, Va=Vda1, Vc=Vinp, Vd=Vda0, Vf=Vinm, Vg=Vinm+ΔVinm, Vi=Vinp+ΔVinp, and Vb=Ve=Vh=Vj=0 into the equation (13).

$$Vx1 = \frac{\Delta Vin(com) - (Vda0 + Vda1)}{4} + Vcm0 + \frac{1}{2}Vcm1 \quad (82)$$

The equation (82) has the term ΔVin(com)/4 related to the common component difference ΔVin(com) between the differential input voltages of the sampling and holding phases. For example, when Vcm0=Vcm1=Vref=2.5 volts (i.e., the median of the power supply voltage), the input voltage Vx1 is expressed from the equation (82) as follows:

+1 ... Vx1=3.125 volts+ΔVin(com)/4

0 ... Vx1=2.5 volts+ΔVin(com)/4

−1 ... Vx1=3.125 volts+ΔVin(com)/4

In normal use, since the term ΔVin(com)/4 is sufficiently small, the op-amp Op works at the median voltage of the power supply voltage so that the op-amp Op can work with the suitable gain and slew rate.

As described above, according to the seventh embodiment, the MDAC 10 employs the sample hold circuit with the differential input. Although the equation (81) has the term ΔVin (diff), the coefficient of the term ΔVin(diff) is 1/2 so that an error introduced by the difference ΔVin(diff) is small. Thus, in the case where the differential input voltage Vinp-Vinm is limited within the certain range, the MDAC 10 can have sufficient accuracy. Therefore, the pipeline ADC and the cyclic ADC can have sufficient accuracy by using the MDAC 10.

Eight Embodiment

Figure 13A:
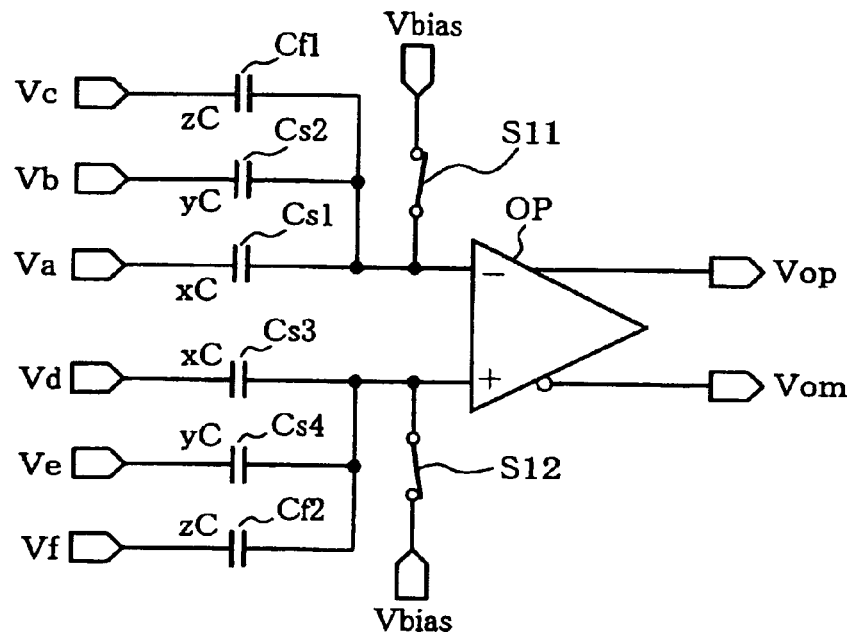
FIGS. 13A and 13B are schematics of a sample hold circuit according to an eighth embodiment of the present invention.
Figure 13B:
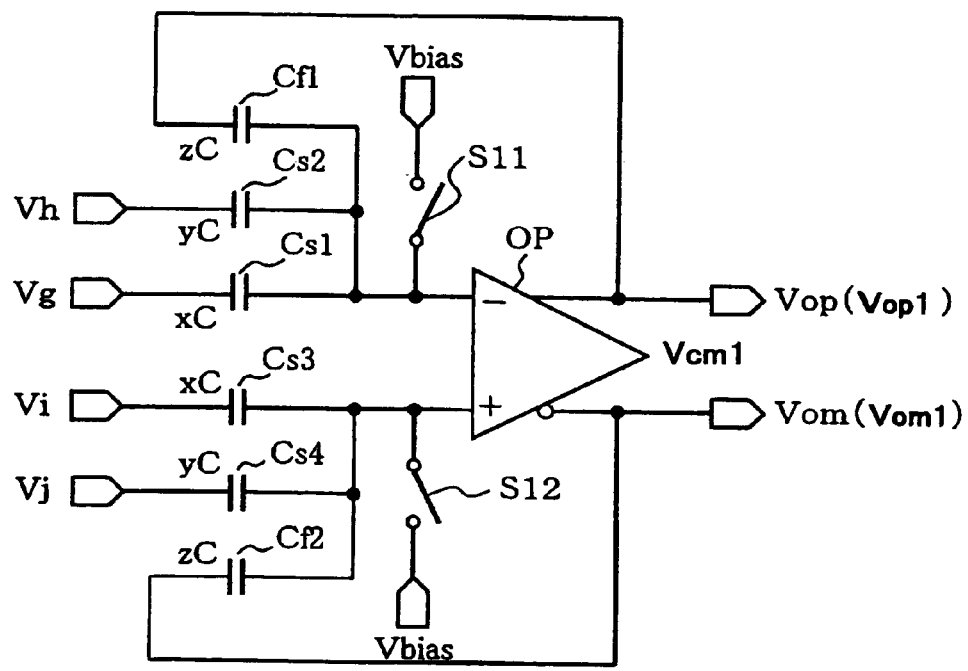

A sample hold circuit according to the eight embodiment is shown in FIGS. 13A and 13B. The sample hold circuit of the eight embodiment is similar in configuration to that of the first embodiment. A difference between the first and eight embodiments is in that the eight embodiment uses switches S11, S12 to charge the capacitors.

The switches S11, S12 are turned on in the sampling phase shown in FIG. 13A and turned off in the sampling phase shown in FIG. 13B. Thus, in the sampling phase, a bias voltage Vbias is applied to the non-inverting and inverting inputs of the op-amp Op through the switches S11, S12, respectively. In such an approach, the sample hold circuit of the eight embodiment works in the same manner as that of the first embodiment.

OTHER EMBODIMENTS

The embodiments described above may be modified in various ways. For example, the number and position of the capacitors to which the input voltage Vin is applied, the total number of the capacitors, the total number of the feedback capacitors, and the capacitance of the capacitor can be adjusted, as long as the necessary requirements of the first to fifth requirements are met.

The sample hold circuit described in the embodiments can be used in devices other than the A/D converter.

Such changes and modifications are to be understood as being within the scope of the present invention as defined by the appended claims.

What is claimed is:

1. A sample hold circuit for sampling and holding an input voltage, the sample hold circuit comprising:
   an operational amplifier that converts the held voltage to a differential output voltage, the operational amplifier having inverting and non-inverting input terminals and inverting and non-inverting output terminals;
   a first plurality of first capacitors each of which is connected to the inverting input terminal;
   a second plurality of second capacitors each of which is connected to the non-inverting input terminal, the second capacitors being paired with the first capacitors to provide a plurality of capacitor pairs in each of which the first and second capacitors have a same capacitance; and
   a control circuit that applies the input voltage to at least one of the first and second capacitors and a predetermined voltage to others of the first and second capacitors in a sampling phase and that connects at least one of the capacitor pairs to the inverting and non-inverting output terminals such that the first and second capacitors of the at least one of the capacitor pairs are connected to the non-inverting and inverting output terminals, respectively, and applies the input voltage to at least one of the first and second capacitors of others of the capacitor pairs in a holding phase, wherein
   a total capacitance of the first and second capacitors to which the input voltage is applied in the sampling phase is equal to a total capacitance of the first and second capacitors to which the input voltage is applied in the holding phase,
   a total capacitance of the first capacitors to which the input voltage is applied in the holding phase is equal to a total capacitance of the second capacitors to which the input voltage is applied in the holding phase, and
   a total capacitance of the first capacitors to which the input voltage is applied in the sampling phase is different from a total capacitance of the second capacitors to which the input voltage is applied in the sampling phase.

2. The sample hold circuit according to claim 1, wherein
   the input voltage is a differential input voltage having an inverting input voltage and a non-inverting input voltage, and
   a capacitance value obtained by subtracting a total capacitance of the second capacitors to which the non-inverting input voltage is applied in the sampling phase from a total capacitance of the first capacitors to which the non-inverting input voltage is applied in the sampling phase is equal to a capacitance value obtained by subtracting a total capacitance of the first capacitors to which the inverting input voltage is applied in the sampling phase from a total capacitance of the second capacitors to which the inverting input voltage is applied in the sampling phase.

3. The sample hold circuit according to claim 1, wherein
   the operational amplifier acts as a voltage follower to bias the inverting and non-inverting terminals of the operational amplifier in the sampling phase.

4. A multiplying digital to analog converter comprising:
   the sample hold circuit of claim 1, wherein
   the control circuit of the sample hold circuit applies the input voltage to at least one of the first and second capacitors in the sampling phase and applies a DAC voltage to at least one of others of the first and second capacitors, and
   the DAC voltage is set in accordance with an input digital value.

5. A sample hold circuit for sampling and holding an input voltage having a predetermined limited range, the sample hold circuit comprising:
   an operational amplifier that converts the held voltage to a differential output voltage, the operational amplifier having inverting and non-inverting input terminals and inverting and non-inverting output terminals;
   a first plurality of first capacitors each of which is connected to the inverting input terminal;
   a second plurality of second capacitors each of which is connected to the non-inverting input terminal, the second capacitors being paired with the first capacitors to provide a plurality of capacitor pairs in each of which the first and second capacitors have a same capacitance; and
   a control circuit that applies the input voltage to at least one of the first and second capacitors and a predetermined voltage to the others of the first and second capacitors in a sampling phase and that connects at least one of the capacitor pairs to the inverting and non-inverting output terminals such that the first and second capacitors of the at least one of the capacitor pairs are connected to the non-inverting and inverting output terminals, respectively, and applies the input voltage to at least one of the first and second capacitors of the others of the capacitor pairs in a holding phase, wherein
   a total capacitance of the first and second capacitors to which the input voltage is applied in the sampling phase is equal to a total capacitance of the first and second capacitors to which the input voltage is applied in the holding phase, and a capacitance value obtained by adding a total capacitance of the first capacitors to which the input voltage is applied in the sampling phase and a total capacitance of the second capacitors to which the input voltage is applied in the holding phase is different from a capacitance value obtained by adding a total capacitance of the second capacitors to which the input voltage is applied in the sampling phase and a total capacitance of the first capacitors to which the input voltage is applied in the holding phase.

6. A sample hold circuit for sampling and holding an input voltage having a predetermined limited range, the sample hold circuit comprising:

an operational amplifier that converts the held voltage to a differential output voltage, the operational amplifier having inverting and non-inverting input terminals and inverting and non-inverting output terminals;

a first plurality of first capacitors each of which is connected to the inverting input terminal;

a second plurality of second capacitors each of which is connected to the non-inverting input terminal, the second capacitors being paired with the first capacitors to provide a plurality of capacitor pairs in each of which the first and second capacitors have a same capacitance; and a control circuit that applies the input voltage to at least one of the first and second capacitors and a predetermined voltage to the others of the first and second capacitors in a sampling phase and that connects at least one of the capacitor pairs to the inverting and non-inverting output terminals such that the first and second capacitors of the at least one of the capacitor pairs are connected to the non-inverting and inverting output terminals, respectively, and applies the input voltage to at least one of the first and second capacitors of the others of the capacitor pairs in a holding phase, wherein a total capacitance of the first and second capacitors to which the input voltage is applied in the sampling phase is equal to a total capacitance of the first and second capacitors to which the input voltage is applied in the holding phase, a total capacitance of the first capacitors to which the input voltage is applied in the sampling phase is different from a total capacitance of the first capacitors to which the input voltage is applied in the holding phase, and a total capacitance of the second capacitors to which the input voltage is applied in the sampling phase is different from a total capacitance of the second capacitors to which the input voltage is applied in the holding phase.

* * * * *